United States Patent
Yamazaki et al.

(10) Patent No.: US 6,429,059 B2
(45) Date of Patent: Aug. 6, 2002

(54) SEMICONDUCTOR DEVICE AND METHOD FOR PRODUCING IT

(75) Inventors: Shunpei Yamazaki, Tokyo; Jun Koyama; Takeshi Fukunaga, both of Kanagawa, all of (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/797,952

(22) Filed: Mar. 5, 2001

Related U.S. Application Data

(62) Division of application No. 09/476,378, filed on Jan. 3, 2000, now Pat. No. 6,204,535, which is a division of application No. 09/157,938, filed on Sep. 22, 1998, now Pat. No. 6,013,930.

(30) Foreign Application Priority Data

Sep. 24, 1997 (JP) .............................. 9-278124
Sep. 30, 1997 (JP) .............................. 9-282565

(51) Int. Cl.$^7$ .............................. H01L 21/00
(52) U.S. Cl. .................. 438/158; 438/166; 438/907
(58) Field of Search ................ 438/158, 159, 438/163, 166, 908, 907

(56) References Cited

U.S. PATENT DOCUMENTS

| 5,457,058 A | * 10/1995 | Yonehara ............... 438/479 |
| 5,595,944 A | 1/1997 | Zhang ................ 438/158 |
| 5,643,826 A | 7/1997 | Ohtani et al. ........... 438/162 |
| 5,677,211 A | 10/1997 | Kaneko ............... 438/158 |
| 5,825,050 A | 10/1998 | Hirakawa ............. 257/57 |
| 5,828,082 A | 10/1998 | Wu ................... 257/57 |
| 5,904,509 A | * 5/1999 | Zhang ................ 438/154 |
| 5,936,278 A | 8/1999 | Hu et al. ............. 257/336 |
| 6,013,930 A | 1/2000 | Yamazaki et al. ....... 429/206 |
| 6,121,660 A | 9/2000 | Yamazaki et al. ....... 257/348 |
| 6,197,624 B1 | * 3/2001 | Yamazaki ............ 438/158 |
| 6,218,219 B1 | 4/2001 | Yamazaki et al. ....... 438/149 |

FOREIGN PATENT DOCUMENTS

| JP | 07-130652 | 5/1995 |
| JP | 8-015686 A | 1/1996 |
| JP | 08-306639 | 11/1996 |

OTHER PUBLICATIONS

H. Hayashi et al., "Fabrication of Low–Temperature Bottom–Gate Poly–Si on Large–Area Substrate by Linear–Beam Excimer Laser Crystallization and ion Doping Method", IEDM95, pp. 829–832, 1995.

Kim et al., "4.4: Planarized Black Matrix on TFT Structure for TFT–LCD Monitors", pp. 19–22, 1997, SID 97 Digest.

Inventors: Shunpei Yamazaki et al., Specification & Drawings of U.S. Patent Application No. 09/797,952, filed: Mar. 5, 2001, "Semiconductor Device and Method for Producing It".

* cited by examiner

*Primary Examiner*—John F. Niebling
*Assistant Examiner*—Stacy Whitmore
(74) *Attorney, Agent, or Firm*—Nixon Peabody LLP; Jeffrey L. Costellia

(57) ABSTRACT

Disclosed is a bottom-gate-type semiconductor device comprising crystalline semiconductor layers, in which the source/drain regions each have a laminate structure comprising a first conductive layer ($n^+$ layer), a second conductive layer ($n^-$ layer) of which the resistance is higher than that of the first conductive layer, and an intrinsic or substantially intrinsic semiconductor layer (i-layer). In this, the $n^-$ layer functions as an LDD region, and the i-layer functions as an in-plane offset region. The semiconductor device has high reliability and high reproducibility, and is produced in a simple process favorable to mass-production.

34 Claims, 25 Drawing Sheets

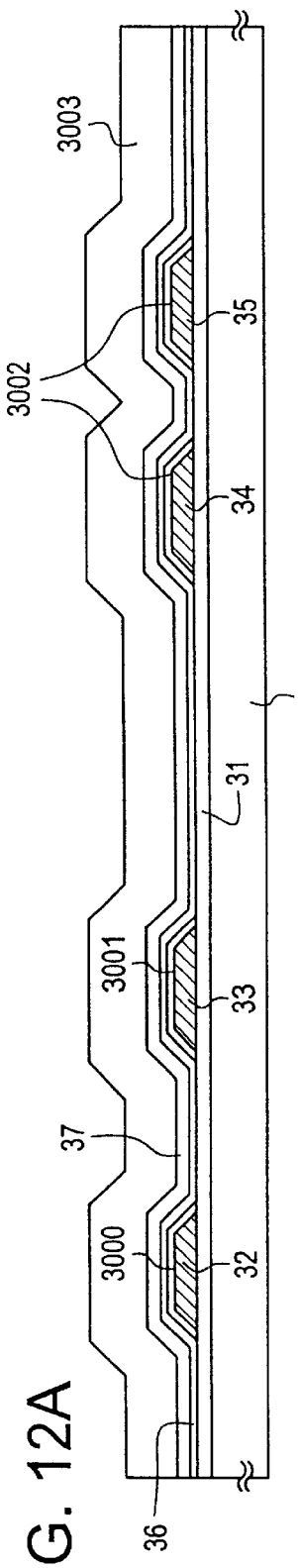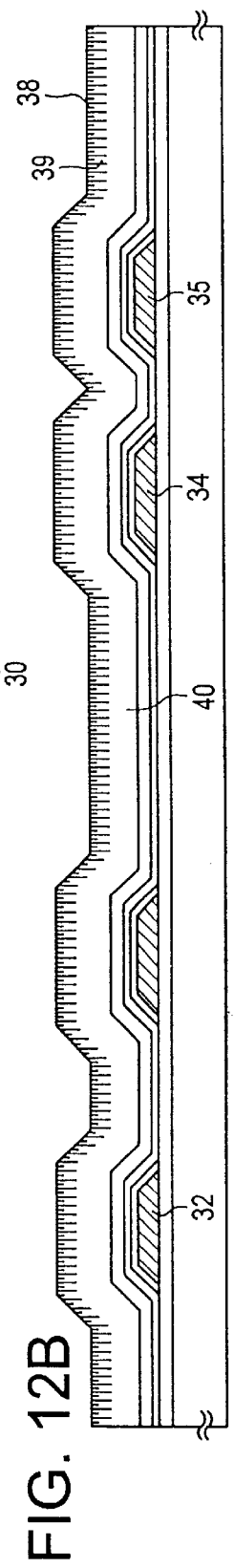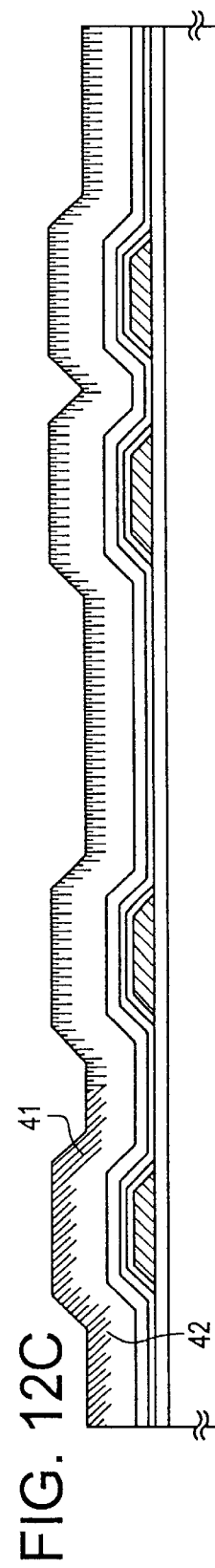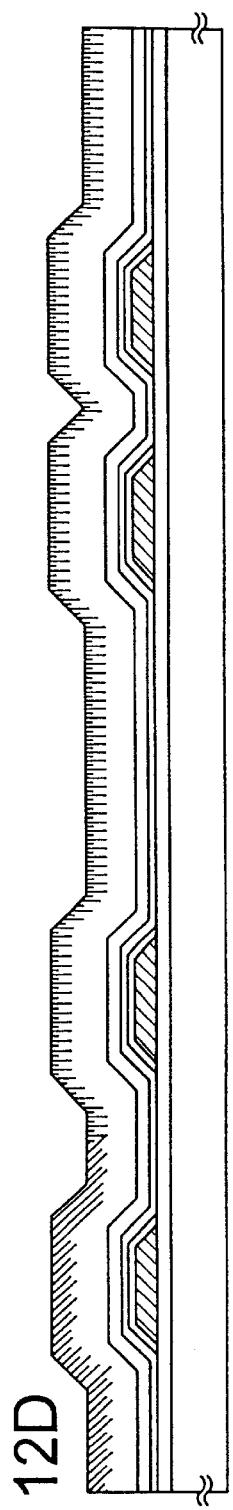

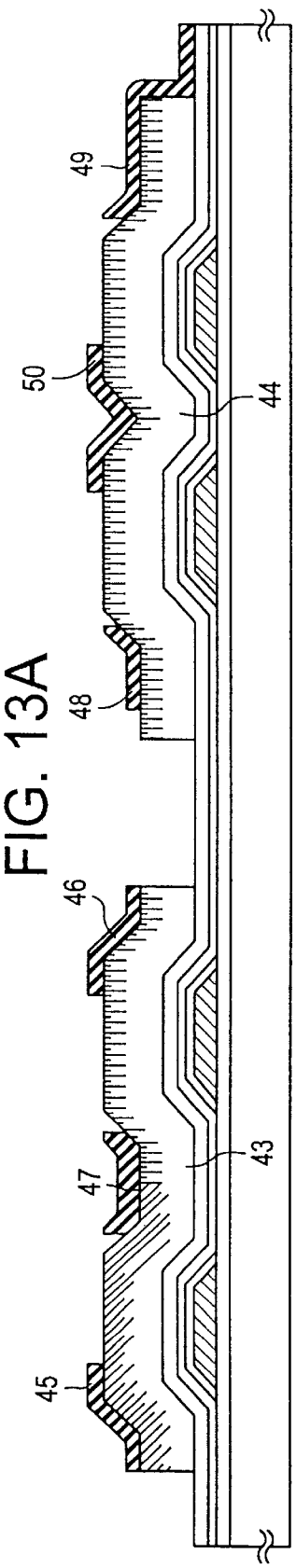
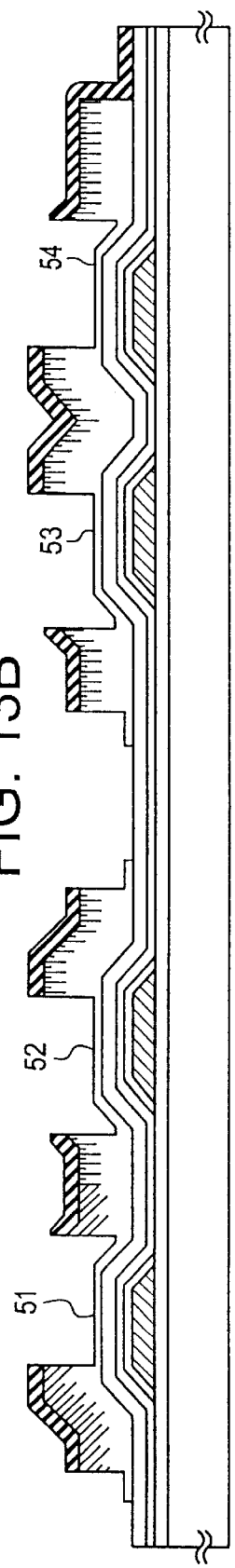
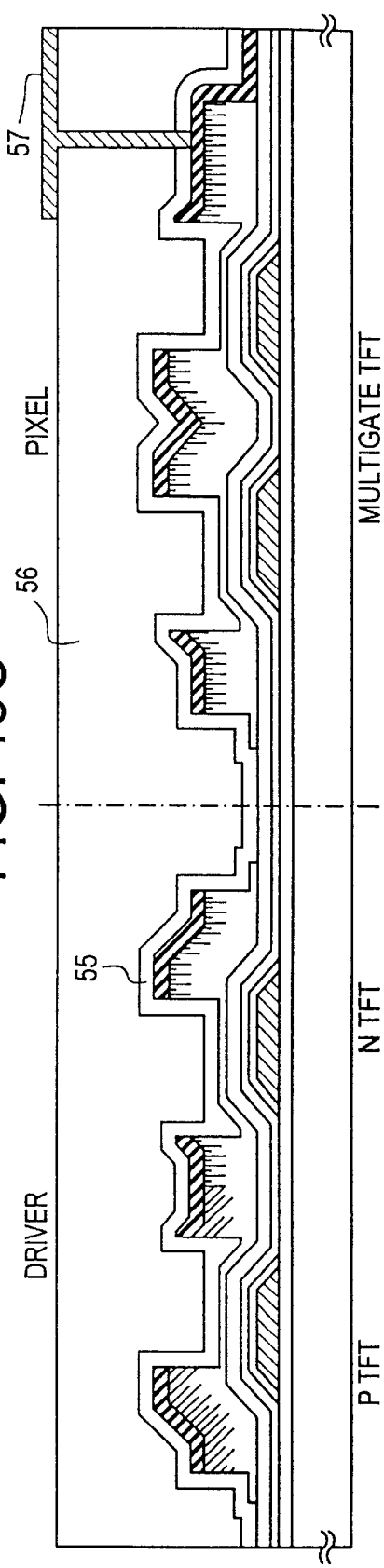

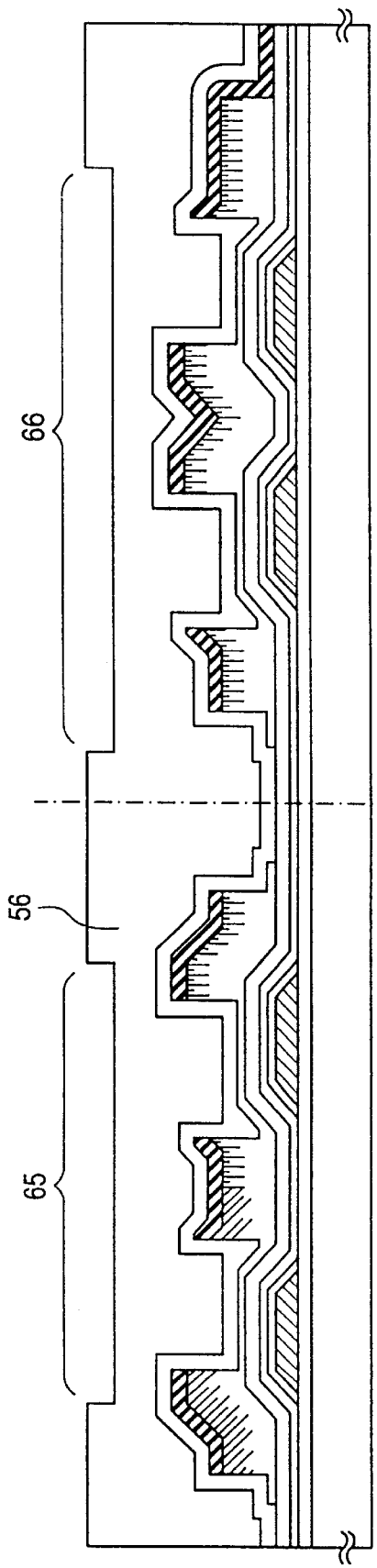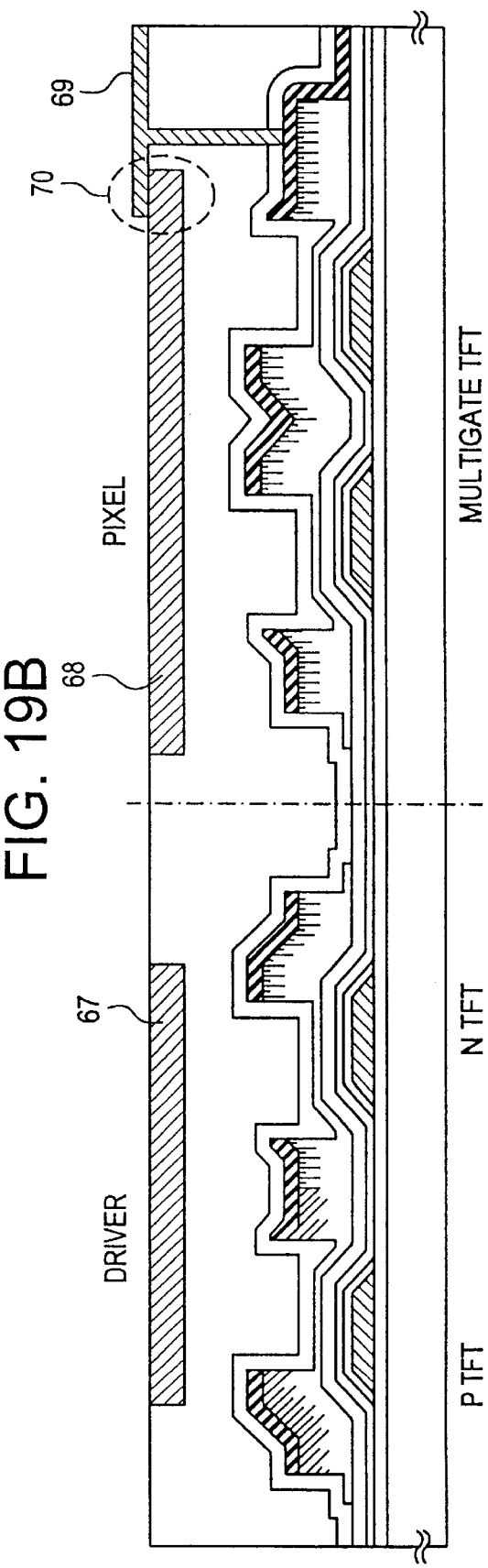

SEMICONDUCTOR DEVICE AND METHOD FOR PRODUCING IT

FIELD OF THE INVENTION

This application is a division of U.S. Ser. No. 09/476,378, filed Jan. 3, 2000, now U.S. Pat. No. 6,204,535, which is a division of U.S. Ser. No. 09/157,938, filed Sep. 22, 1998, now U.S. Pat. No. 6,013,930.

The present invention relates to a semiconductor device that comprises thin semiconductor films having a crystalline structure, and to a method for producing it. In particular, it relates to the constitution of thin film transistors (hereinafter referred to as TFT) having an inverse stagger structure. It also relates to the constitution of semiconductor circuits, electro-optical devices and electronic instruments having those TFT.

The terminology "semiconductor device" referred to herein is directed to any and every device that functions on the basis of semiconductor characteristics; and TFT, semiconductor circuits, electro-optical devices and electronic instruments referred to herein is all within the category of that terminology, semiconductor device.

BACKGROUND OF THE INVENTION

TFT have heretofore been being used as switching elements in active matrix-type liquid crystal devices (hereinafter referred to as AMLCD). At present, devices with TFT circuits that comprise active layers of amorphous silicon films have a high market share. In particular, inverse stagger structures capable of being produced in simple processes are much employed for constructing TFT.

With recent developments in high-quality AMLCD, however, TFT are being required to have much better operating characteristics (especially for high operating speed). In such situations, amorphous silicon TFT are often unsatisfactory as their operating speed is not high, and high-quality devices comprising amorphous silicon films are difficult to produce.

Accordingly, polysilicon TFT have become much highlighted in place of amorphous silicon TFT, and TFT comprising polysilicon films as the active layers are being actively studied and developed in the art. At present, some polysilicon TFT devices are on the market.

Many reports have already been disclosed, relating to inverse stagger-type TFT structures comprising active layers of polysilicon films. For example, referred to is a report of "Fabrication of Low-Temperature Bottom-Gate Poly-Si TFTs on Large-Area Substrate by Linear-Beam Excimer Laser Crystallization and Ion Doping Method: H. Hayashi, et al., IEDM 95, pp. 829–832, 1995".

In that report, they illustrated one typical example (FIG. 4) of inverse stagger structures comprising polysilicon films. However, inverse stagger structures of that type (that is, so-called channel-stop-type ones) have various problems.

First, in those structures, the active layers having an overall thickness of 50 nm or so are extremely thin. Therefore, in those, impact ionization at the junction of the channel-forming region and the drain region is occurred, whereby the structures are significantly deteriorated due to hot carrier implantation. For these reasons, a large LDD region (light doped drain region) must be formed in those structures.

In this connection, the most critical problem is how to control the LDD region. The LDD region requires extremely delicate control of the impurity concentration therein and the length of itself. In particular, the length control of the region is problematic. At present, the length of the LDD region is defined by mask patterning. In fine TFT, however, any minor patterning error in masking the LDD region will produce significant differences in TFT characteristics.

Another serious problem is that the sheet resistivity in the LDD region significantly varies depending on the variation in the thickness of the active layers. Moreover, the variation in the taper angle of the gate electrodes often causes the variation in the function of the LDD region.

In addition, the LDD region requires patterning, which directly complicates the production process while lowering the throughput. It is presumed that the production of the inverse stagger structure described in the report noted above requires at least 6 masks (up to the step of forming the source/drain electrodes).

As mentioned above, the channel-stop-type inverse stagger structure indispensably requires the transverse in-plane LDD region to be formed at the both sides of the channel-forming region, in which, however, a reproducible LDD region is extremely difficult to form.

SUMMARY OF THE INVENTION

The subject matter of the present invention is to provide a technique for producing highly-reliable and highly-reproducible semiconductor devices in an extremely simple process applicable to mass-production.

One aspect of the invention is a semiconductor device having a semiconductor film comprising a source region, a drain region and a channel-forming region, the semiconductor films having a crystalline structure, wherein the source region and the drain region each have a laminate structure comprising at least a first conductive layer, a second conductive layer of which the resistance is higher than that of the first conductive layer, and a third semiconductor layer of which the conductivity type is the same as that of the channel-forming region, the layers being laminated in that order toward the gate-insulating film.

In one embodiment of the constitution of this aspect, the semiconductor film having a crystalline structure have a grain boundary distribution peculiar to fusion-crystallized films.

In another embodiment, the concentration profile of the impurity constituting the first and second conductive layers varies continuously from the first conductive layer to the second conductive layer.

In still another embodiment, the second conductive layer contains an impurity that varies continuously within the range of from $5 \times 10^{17}$ to $1 \times 10^{19}$ atoms/cm3.

In still another embodiment, two offset regions each having a different thickness exist between the channel-forming region and the second conductive layer.

In still another embodiment, an offset region of which the thickness is larger than that of the channel-forming region exists between the channel-forming region and the second conductive layer.

Another aspect of the invention is a semiconductor device having a gate electrode formed on a substrate having an insulating surface; a semiconductor film comprising a source region, a drain region and a channel-forming region, the semiconductor having a crystalline structure; and a source electrode and a drain electrode as formed on the source region and the drain region, respectively, wherein the source region and the drain region each have a laminate structure comprising at least a first conductive layer, a second conductive layer of which the resistance is higher than that of the first conductive layer, and a third semiconductor layer of which the conductivity type is the same as that of the channel-forming region, the layers being laminated in that order toward the gate-insulating film, and the source electrode and/or the drain electrode overlap(s) with the gate electrode on the channel-forming region.

Still another aspect of the invention is a semiconductor device having a semiconductor film comprising a source region, a drain region and a channel-forming region, the semiconductor film having a crystalline structure, wherein the source region and the drain region each have a laminate structure comprising at least a first conductive layer, a second conductive layer of which the resistance is higher than that of the first conductive layer, and a third semiconductor layer of which the conductivity type is the same as that of the channel-forming region, the layers being laminated in that order toward the gate-insulating film, and wherein an HRD structure comprising two offset regions each having a different thickness and the second conductive layer is formed between the channel-forming region and the first conductive layer.

In one embodiment of the constitution of this aspect, one of the two offset regions each having a different thickness is for offset in the in-plane direction and is formed of a semiconductor layer of which both the conductivity type and the thickness are the same as those of the channel-forming region, while the other is for offset in the thickness direction and is formed of a semiconductor layer of which the conductivity type is the same as that of the channel-forming region but of which the thickness is larger than that of the channel-forming region.

Still another aspect of the invention is a method for producing a semiconductor device, which comprises the steps of;

forming a gate electrode, a gate-insulating layer, and an amorphous semiconductor film on a substrate having an insulating surface, exposing the amorphous semiconductor film to laser beams or to intense light equivalent to laser beams to thereby convert it into a semiconductor film having a crystalline structure, adding an impurity selected from Group 15 only or from Group 13 and Group 15 to the semiconductor film having a crystalline structure to form conductive layers, forming a source electrode and a drain electrode on the conductive layers, and etching the semiconductor film having a crystalline structure via the source electrode and the drain electrode both acting as masks for the film to thereby form a channel-forming region.

Still another aspect of the invention is a method for producing a semiconductor device, which comprises the steps of:

forming a gate electrode, a gate-insulating layer, and an amorphous semiconductor film on a substrate having an insulating surface;

irradiating the amorphous semiconductor film with laser beams or to intense light equivalent to laser beams to thereby convert it into a semiconductor film having a crystalline structure, adding an impurity selected from Group 15 only or from Group 13 and Group 15 to the semiconductor film having a crystalline structure to form conductive layers, forming a source electrode and a drain electrode on the conductive layers, etching the semiconductor film having a crystalline structure via the source electrode and the drain electrode both acting as masks for the film to thereby form a channel-forming region, and adding to only the channel-forming region an impurity for threshold voltage control, via the source electrode and the drain electrode both acting as masks for the region.

Still another aspect of the invention is a bottom-gate-type semiconductor device having a semiconductor film comprising a source region, a drain region and a channel-forming region, the semiconductor film having a crystalline structure, wherein the semiconductor film has a grain boundary distribution peculiar to fusion-crystallized films, and wherein the source region and the drain region each have a laminate structure comprising at least a first conductive layer, a second conductive layer of which the resistance is higher than that of the first conductive layer, and a third semiconductor layer of which the conductivity type is the same as that of the channel-forming region, the layers being laminated in that order toward the gate-insulating film.

Still another aspect of the invention is a bottom-gate-type semiconductor device having a semiconductor film comprising a source region, a drain region and a channel-forming region, all of semiconductor layers having a crystalline structure, wherein;

the semiconductor layers have a grain boundary distribution peculiar to fusion-crystallized films, the source region and the drain region each have a laminate structure comprising at least a first conductive layer, a second conductive layer of which the resistance is higher than that of the first conductive layer, and a semiconductor layer of which the conductivity type is the same as that of the channel-forming region, the layers being laminated in that order toward the gate-insulating film, and the concentration profile of the impurity constituting the first and second conductive layers varies continuously from the first conductive layer to the second conductive layer.

Still another aspect of the invention is a bottom-gate-type semiconductor device comprising a source region, a drain region and a channel-forming region, all of semiconductor layers having a crystalline structure, wherein;

the semiconductor layers have a grain boundary distribution peculiar to fusion-crystallized films, the source region and the drain region each have a laminate structure comprising at least a first conductive layer, a second conductive layer of which the resistance is higher than that of the first conductive layer, and a semiconductor layer of which the conductivity type is the same as that of the channel-forming region, the layers being laminated in that order toward the gate-insulating film, and the second conductive layer contains an impurity that varies continuously within the range of from $5 \times 10^{17}$ to $1 \times 10^{19}$ atoms/cm3.

Still another aspect of the invention is a bottom-gate-type semiconductor device comprising a source region, a drain region and a channel-forming region, all of semiconductor layers having a crystalline structure, wherein;

the semiconductor layers have a grain boundary distribution peculiar to fusion-crystallized films, the source region and the drain region each have a laminate structure comprising at least a first conductive layer, a second conductive layer of which the resistance is higher than that of the first conductive layer, and a semiconductor layer of which the conductivity type is the same as that of the channel-forming region, the layers being laminated in that order toward the gate-insulating film, and two offset regions each having a different thickness exist between the channel-forming region and the second conductive layer.

Still another aspect of the invention is a bottom-gate-type semiconductor device comprising a source region, a drain region and a channel-forming region, all of semiconductor layers having a crystalline structure, wherein;

the semiconductor layers have a grain boundary distribution peculiar to fusion-crystallized films, the source region and the drain region each have a laminate structure comprising at least a first conductive layer, a second conductive layer of which the resistance is higher than that of the first conductive layer, and a semiconductor layer of which the conductivity type is the same as that of the channel-forming region, the layers being laminated in that order toward the gate-insulating film, and an offset region of which the thickness is larger than that of the channel-forming region exists between the channel-forming region and the second conductive layer.

Still another aspect of the invention is a bottom-gate-type semiconductor device comprising;

a gate electrode formed on a substrate having an insulating surface, a source region, a drain region and a channel-forming region, all of semiconductor layers having a crystalline structure, and a source electrode and a drain electrode as formed on the source region and the drain region, respectively, wherein;

the semiconductor layers have a grain boundary distribution peculiar to fusion-crystallized films, the source region and the drain region each have a laminate structure comprising at least a first conductive layer, a second conductive layer of which the resistance is higher than that of the first conductive layer, and a semiconductor layer of which the conductivity type is the same as that of the channel-forming region, the layers being laminated in that order toward the gate-insulating film, and the source electrode and/or the drain electrode overlap(s) with the gate electrode on the channel-forming region.

Still another aspect of the invention is a bottom-gate-type semiconductor device comprising a source region, a drain region and a channel-forming region, all of semiconductor layers having a crystalline structure, wherein;

the semiconductor layers have a grain boundary distribution peculiar to fusion-crystallized films, the source region and the drain region each have a laminate structure comprising at least a first conductive layer, a second conductive layer of which the resistance is higher than that of the first conductive layer, and a semiconductor layer of which the conductivity type is the same as that of the channel-forming region, the layers being laminated in that order toward the gate-insulating film, and an HRD structure comprising two offset regions each having a different thickness and the second conductive layer exists between the channel-forming region and the first conductive layer.

In one embodiment of the constitutions noted above, one of the two offset regions each having a different thickness is for offset in the in-plane direction and is formed of a semiconductor layer of which both the conductivity type and the thickness are the same as those of the channel-forming region, while the other is for offset in the thickness direction and is formed of a semiconductor layer of which the conductivity type is the same as that of the channel-forming region but of which the thickness is larger than that of the channel-forming region.

Still another aspect of the invention is a method for producing a semiconductor device, which comprises;

a step of forming a gate electrode, a gate-insulating layer, and an amorphous semiconductor film on a substrate having an insulating surface, a step of exposing the amorphous semiconductor film to laser beams or to intense light of which the intensity is equivalent to that of laser beams, to thereby crystallize the film into a semiconductor film having a crystalline structure, a step of adding an impurity selected from Group 13 and/or Group 15 to the semiconductor film having a crystalline structure through ion implantation or ion doping, to thereby form first and second conductive layers containing the impurity, a step of exposing the conductive layers to laser beams or to intense light of which the intensity is equivalent to that of laser beams, to thereby activate the impurity, a step of forming a source electrode and a drain electrode on the conductive layers, and a step of etching the semiconductor film having a crystalline structure via the source electrode and the drain electrode both acting as masks for the film to thereby form a channel-forming region, and wherein;

the thicknesses of the first and second conductive layers are controlled by the concentration profile of the impurity.

Still another aspect of the invention is a method for producing a semiconductor device, which comprises;

a step of forming a gate electrode, a gate-insulating layer, and an amorphous semiconductor film on a substrate having an insulating surface, a step of exposing the amorphous semiconductor film to laser beams or to intense light of which the intensity is equivalent to that of laser beams, to thereby crystallize the film into a semiconductor film having a crystalline structure, a step of adding an impurity selected from Group 13 and/or Group 15 to the semiconductor film having a crystalline structure through ion implantation or ion doping, to thereby form first and second conductive layers containing the impurity, a step of exposing the conductive layers to laser beams or to intense light of which the intensity is equivalent to that of laser beams, to thereby activate the impurity, a step of forming a source electrode and a drain electrode on the conductive layers, a step of etching the semiconductor film having a crystalline structure via the source electrode and the drain electrode both acting as masks for the film to thereby form a channel-forming region, and a step of adding to the channel-forming region an impurity for threshold voltage control, via the source electrode and the drain electrode both acting as masks for the region, and wherein;

the thicknesses of the first and second conductive layers are controlled by the concentration profile of the impurity.

BRIEF DESCRIPTION OF THE DRAWINGS

FIG. 12A to FIG. 12D, and FIG. 13A to FIG. 13C show a process for producing a semiconductor circuit in Embodiment 10.

FIG. 19A and FIG. 19B show the constitution of a pixel TFT in Embodiment 15.

DESCRIPTION OF PREFERRED EMBODIMENTS OF THE INVENTION

Figure 1A:
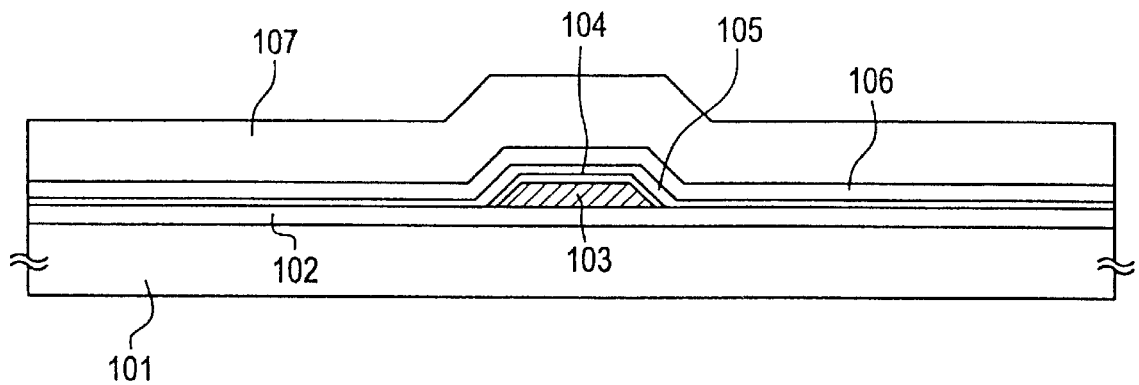
FIG. 1A to FIG. 1D, and FIG. 2A to FIG. 2C show a process for producing a thin film transistor in Embodiment 1.

The following Embodiments are to demonstrate preferred embodiments of the invention having the constitution noted above, which, however, are not intended to restrict the scope of the invention. In those, referred to are FIG. 1 to FIG. 29.

Embodiment 1

This is to demonstrate one typical embodiment of the invention with reference to FIGS. 1A to 3. First referred to are FIG. 1A to FIG. 1D and FIG. 2A to FIG. 2C which illustrate a method for producing the semiconductor device of the invention. As illustrated, a undercoating film 102 of an insulating film comprising mainly silicon is formed on a glass substrate 101 to prepare a substrate having an insulating surface. A gate electrode (first wiring) 103 of a conductive film is formed on the film 102.

The line width of the gate electrode 103 is from 1 to 10 m (typically from 3 to 5 m). The thickness thereof is from 200 to 500 nm (typically from 250 to 300 nm). In this Embodiment, used is an aluminum film (containing 2 wt. % scandium) having a thickness of 250 nm to form the gate electrode having a line width of 3 m.

As the gate electrode 103, also usable is any of tantalum, tungsten, titanium, chromium, molybdenum, conductive silicon, metal silicide or their laminates, in place of aluminum. The aluminum film is patterned (first patterning to form the gate electrode).

Next, the gate electrode 103 is subjected to anodic oxidation to form an oxide film 104 having a thickness of from 50 to 200 nm (typically from 100 to 150 nm). The oxide film 104 is to protect the gate electrode. In this Embodiment, the anodic oxidation is performed in an ethylene glycol solution containing 3% tartaric acid (this is neutralized with ammonia) at a voltage of 80 V and a formation current of from 5 to 6 mA. The oxide film thus formed may have a thickness of about 100 nm or so.

Next formed is a gate-insulating layer comprising a silicon nitride film 105 (having a thickness of from 0 to 200 nm, typically from 25 to 100 nm, but preferably 50 nm) and a silicon oxynitride or silicon oxide film 106 of SiOxNy (having a thickness of from 150 to 300 nm, typically 200 nm). In this Embodiment, the gate-insulating layer includes the oxide film 104.

After the gate-insulating film has been formed, an amorphous semiconductor film 107 comprising mainly silicon is formed over this. In this Embodiment, formed is an amorphous silicon film, which, however, is not limitative. In place of the amorphous silicon film, also usable is any other compound semiconductor film (e.g., germanium-containing amorphous silicon film, etc.).

In this Embodiment, since a channel-etched bottom-gate-type structure is formed, the amorphous silicon film 107 should be thick. Its thickness may fall between 100 and 600 nm (typically between 200 and 300 nm, but preferably 250 nm). In this Embodiment, the thickness of the film 107 is 200 nm. As will be mentioned hereinafter, the optimum thickness of the amorphous silicon film to be formed in this step will be determined depending on the offset region and the LDD region to be formed in TFT of the invention.

In this Embodiment, the amorphous silicon film 107 is formed through low pressure thermal CVD. For this, it is desirable that the concentration of impurities of carbon, oxygen and nitrogen is drastically and severely controlled during the film forming step. If those impurities exist and remain too much in the film formed in this step, they may have some negative influences on the uniformity of the crystallinity of the crystalline semiconductor film to be formed from the film.

In this Embodiment, the impurity concentration is so controlled that carbon and nitrogen are less than $5 \times 10^{18}$ atoms/cm3 (typically not more than $5 \times 10^{17}$ atoms/cm3), and oxygen is less than $1.5 \times 10^{19}$ atoms/cm3 (typically not more than $1 \times 10^{18}$ atoms/cm3). Under this control, the impurity concentration to be finally in the channel-forming region of TFT could be within the defined range.

Figure 1B:
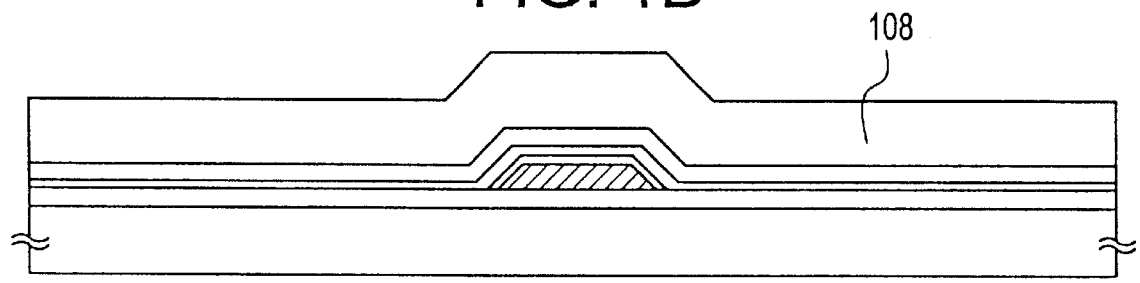

As a result of these steps, obtained is the structure of FIG. 1A, which is then exposed to laser beams to thereby crystallize the amorphous silicon film 107. (FIG. 1B)

As the laser beams, a pulse-oscillation excimer laser may be employed, for which is used KrF (248 nm), XeCl (308 nm), ArF (193 nm) or the like as the excitation gas. In place of this, available are any other various laser beams including Nd:YAG laser harmonics, etc.

For thick amorphous semiconductor films, as in this Embodiment, preferred are laser beams having a long wavelength as facilitating uniform and entire crystallization of the films. Also preferred is additionally heating the substrate at a temperature falling within the range between 50 and 500_C or so, during exposure to laser beams. In consideration of wavelength cycle of the laser beams to be used into consideration, still preferred is so controlling the thickness of the amorphous semiconductor film to be crystallized that the light absorbing efficiency of the film is increased.

In this Embodiment, pulse-oscillation XeCl excimer laser beams are transformed into linear beams in an optical system, and scanned over the amorphous silicon film 107 from one end of the substrate to the other end thereof, whereby the entire surface of the film 107 is annealed with the laser beams.

In this step, the oscillation frequency is 30 MHz, the scanning speed is 2.4 mm/sec, the laser energy is from 300 to 400 mJ/cm2, and the substrate is heated at 400_C from its back surface. As a result of this step, formed is a crystalline semiconductor film (in this Embodiment, crystalline silicon film) 108.

Since the heat absorption differs between the amorphous silicon film and the glass substrate, the amorphous silicon film could be intensively heated if the upper surface of the film is exposed to laser beams. In that manner, therefore, the amorphous silicon film could be heated at a temperature higher than the temperature that the glass substrate could bear (650_C or so).

Semiconductor films crystallized through exposure to laser beams such as that formed in this Embodiment (the semiconductor films of that type are herein referred to as fusion-crystallized films) have a grain boundary distribution (existence distribution of grain boundaries) peculiar to laser crystallization. Observing the grain boundaries in the film through a known technique of secondary etching could definitely clarify the crystal grains and the grain boundaries existing in the film, from which it is known that the film is an aggregate of crystal grains having a grain size of from tens to hundreds nm.

On the other hand, semiconductor films crystallized by any other crystallization means obviously differ from the fusion-crystallized films in the mode of grain boundary distribution. This is because, in the crystallization with laser beams (or with intense light of which the intensity is equivalent to that of laser beams), the semiconductor layers being crystallized are once fused; whilst in the semiconductor layers being crystallized by any other means, the grains grows in a mode of solid-phase growth. Thus, the crystallization mechanism of this invention differs from those of the any other methods.

Next, an element selected from Group 15 (typically phosphorus, arsenic or antimony) is added to the crystalline semiconductor film through ion implantation (with mass separation) or ion doping (without mass separation). In this Embodiment, phosphorus is added to the crystalline silicon film 108 while being so controlled that the phosphorus concentration in the depth that ranges between 30 and 100 nm (typically between 30 and 50 nm) from the surface of the film 108 may fall between $1\times1019$ and $3\times1021$ atoms/cm3, but typically between $1\times1020$ and $1\times1021$ atoms/cm3.

In this Embodiment, the region 109 thus formed in that manner noted above to have such a high phosphorus concentration is referred to as an n+ layer (or a first conductive layer). The thickness of this layer is defined to fall between 30 and 100 nm (typically between 30 and 50 nm). In the present case, the n+ layer 109 will function later as a part of source/drain electrodes. In this Embodiment, the n+ layer is formed to have a thickness of 30 nm.

Figure 1C:
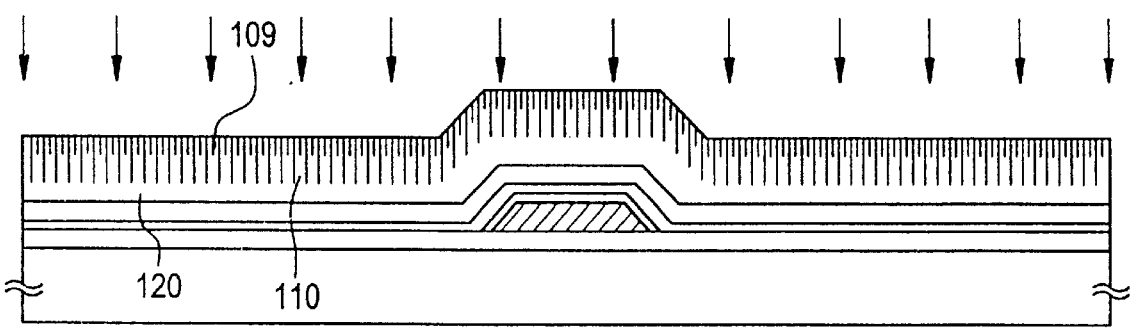

The region 110 to be formed below the n+ layer 109 has a low phosphorus concentration, and this is referred to as an n− layer (or a second conductive layer). In the present case, the resistance of the n− layer 110 is higher than that of the n+ layer 109, and the n− layer 110 function later as an LDD region for field relaxation. In this Embodiment, the n− layer 110 has a thickness of 30 nm. The intrinsic or substantially intrinsic region 120 to be formed below the n− layer 110 is referred to as an i-layer. In the i-layer 120, formed is a channel-forming region. (FIG. 1C)

In this step of phosphorus addition, the phosphorus concentration profile in the direction of the depth of the film 108 is of critical importance. This will be described with reference to FIG. 4. The concentration profile illustrated in FIG. 4 is for an example of phosphine (PH3) addition as performed through ion-doping at an accelerated voltage of 80 keV and an RF power of 20 W.

Figure 4:
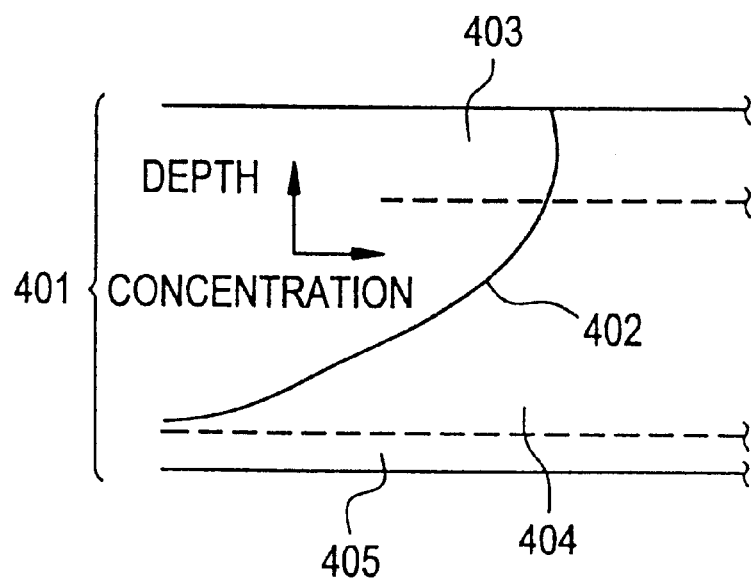
FIG. 4 is a graph showing an impurity concentration profile in a semiconductor film in Embodiment 1.

In FIG. 4, 401 indicates a crystalline silicon film, and 402 indicates the concentration profile of phosphorus added to the film. The concentration profile is determined, depending on the defined conditions of the RF power, the species of the ion added, the accelerated voltage, etc.

In the illustrated case, the peak of the concentration profile 402 is inside the n+ layer 403 or around the interface of the n+ layer 403, and the phosphorus concentration decreases more in the deeper site of the crystalline silicon film 401 (that is, in the site nearer to the gate-insulating film). In this, the phosphorus concentration varies continuously throughout the inside of the film, and therefore, the n− layer 404 is always formed below the n+ layer 403.

Also inside the n⁻ layer 404, the phosphorus concentration continuously decreases. In this Embodiment, the region in which the phosphorus concentration is over $1\times10^{19}$ atoms/cm$^3$ is considered as the n$^+$ layer 403, while that in which the phosphorus concentration falls within the range between $5\times10^{17}$ and $1\times10^{19}$ atoms/cm$^3$ is as the n$^-$ layer 404. However, since no definite boundary exists between the layers 403 and 404, the phosphorus concentration range noted above may be a rough criterion for those layers.

The region having a greatly lowered phosphorus concentration and the layer below the region constitute an intrinsic or substantially intrinsic region (i-layer) 405. The intrinsic region is a region to which no impurity is intentionally added. The substantially intrinsic region indicates a region in which the impurity concentration (the phosphorus concentration in this Embodiment) is not higher than the spin density of the silicon film, or a region having an impurity concentration of from $1\times10^{14}$ to $1\times10^{17}$ atoms/cm$^3$ and exhibiting one conductivity.

The intrinsic or substantially intrinsic region of that type is formed below the n⁻ layer 404. However, the i-layer 405 is basically formed of a semiconductor layer of which the conductivity is the same as that of the channel-forming region. In other words, where the channel-forming region is of a weakly n-type or p-type, the i-layer has the same type of conductivity as that of the channel-forming region.

As in the above, the ion implantation or ion doping to form the n⁺ layer produces the n⁻ layer below the n⁺ layer. However, if the n⁺ layer is formed according to a conventional film forming method, the constitution of that type could not be realized. Where the conditions for ion addition are suitably defined, the thicknesses of the n⁺ layer and the n⁻ layer to be formed are easy to control.

In particular, the thickness of the n⁻ layer requires highly accurate control, as it is to be the thickness of the LDD region to be formed later. In ion doping or the like where the conditions for ion addition are suitably defined, the ion concentration profile in the depthwise direction of the film can be controlled accurately, and the thickness of the LDD region to be formed later is easy to control. In the present invention, the thickness of the n⁻ layer 110 is controlled to fall between 30 and 200 nm (typically between 50 and 150 nm).

The concentration profile illustrated in FIG. 4 is one attained in one doping step. Apart from this, the doping step may be repeated plural times to control the thicknesses of the n⁺ layer 403 and the n⁻ layer 404. For example, doping at a high dose to produce the peak of the concentration profile in a relatively shallow site where the n⁺ layer 403 is to be formed may be combined with doping at a low dose to produce the peak of the concentration profile in a relatively deep site where the n⁻ layer 404 is to be formed.

Figure 1D:
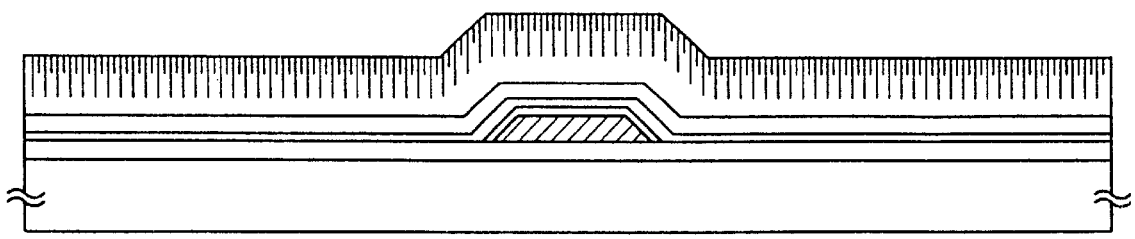

After the n⁺ layer 109 and the n⁻ layer 110 have been formed in that manner noted above, they are again exposed to laser beams whereby the impurity (phosphorus) added thereto is activated. (FIG. 1D)

Apart from laser annealing, also available for this is lamp annealing (exposure to intense light) or furnace annealing (heating in an electric furnace). In the furnace annealing, however, the heat resistance of the glass substrate is taken into consideration.

In this Embodiment, the layers are subjected to laser annealing with XeCl excimer laser beams. For this, the processing conditions may be basically the same as those for the crystallization step noted above. In this, however, the laser energy may be from 200 to 350 mJ/cm² (typically from 250 to 300 mJ/cm²). During the laser annealing, the substrate is heated at 300_C from its back surface, whereby the phosphorus activation is promoted.

In the laser activation step, the crystalline silicon film 108 damaged in the phosphorus addition step may be restored. In this step, the region of the film 108 made to be amorphous due to the ion collision in the ion addition step may be recrystallized.

Figure 2A:
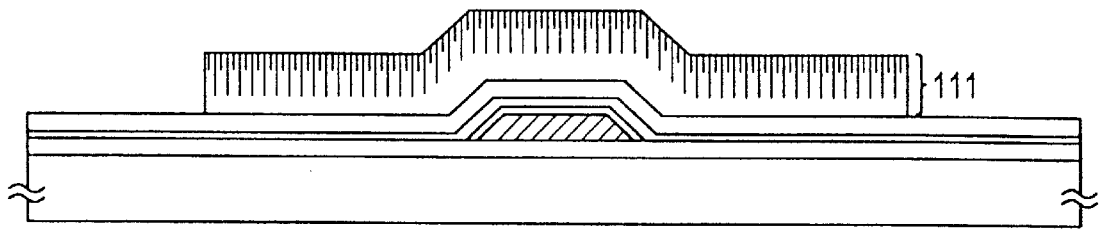

After the phosphorus activation step, the crystalline silicon film is patterned to form an island semiconductor layer 111. In this step, the length of the layer 111 in the direction vertical to the carrier-moving direction in the final TFT to be produced herein (this length corresponds to the channel width, W) is so controlled that it falls between 1 and 30_m (typically between 10 and 20_m). The second patterning step is thus performed herein. (FIG. 2A)

Though not shown in the drawings, a part of the exposed gate-insulating layer is etched to form a contact hole (in the region 118 in FIG. 2C), through which the gate electrode (first wiring) and the electrodes to be formed in the next step (second wiring) are electrically connected with each other. The third patterning step is thus performed herein.

Figure 2B:
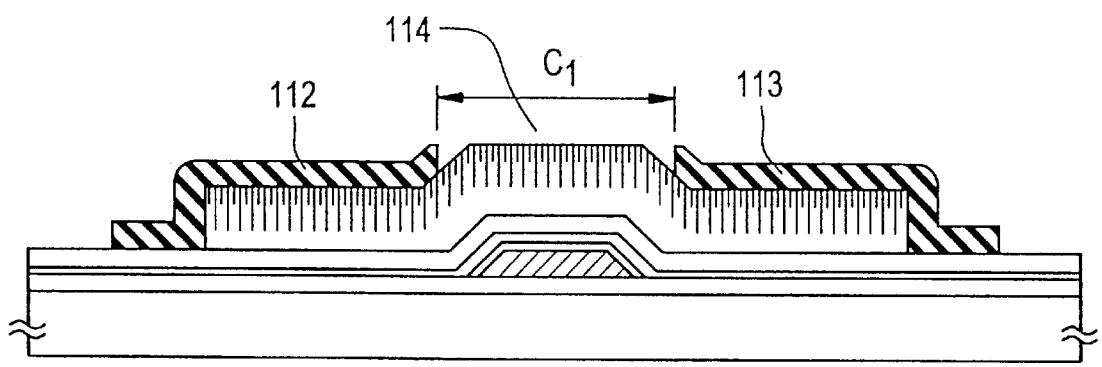

Next, a conductive metal film (not shown) is formed, which is then patterned to give the source electrode 112 and the drain electrode 113. In this Embodiment, a three-layered laminate film of Ti (50 nm)/Al (200 to 300 nm)/Ti (50 nm) is formed. In this step, formed is the wiring for electrically connecting the electrodes 112 and 113 with the gate electrode. The fourth patterning step is thus performed herein. (FIG. 2B)

As will be again mentioned hereinafter, the length of the region 114 just above the gate electrode 103, or that as sandwiched between the source electrode 112 and the drain electrode 113 (this region 114 is referred to as a channel-etching region, and its length is indicated by $C^1$) will determine the length of the channel-forming region and that of the offset region to be formed later. The length $C^1$ may fall between 2 and 20_m (typically between 5 and 10_m). In this Embodiment, $C^1$=4_m.

Next, the island semiconductor layer 111 is self-alignedly dry-etched via the source electrode 112 and the drain electrode 113 both acting as masks. In this step, therefore, only the channel-etching region 114 is etched. (FIG. 2C)

In this etching step, the n⁺ layer 109 and the n⁻ layer 110 are completely removed, but the intrinsic or substantially intrinsic region (i-layer) only is not removed and remains as it is without being etched. In the present invention, only the semiconductor layer of being from 10 to 100 nm (typically from 10 to 75 nm, but preferably from 15 to 45 nm) in thickness remains as it is without being etched in this etching step. In this Embodiment, the semiconductor layer having a thickness of 30 nm remains as it is in this step.

Figure 2C:
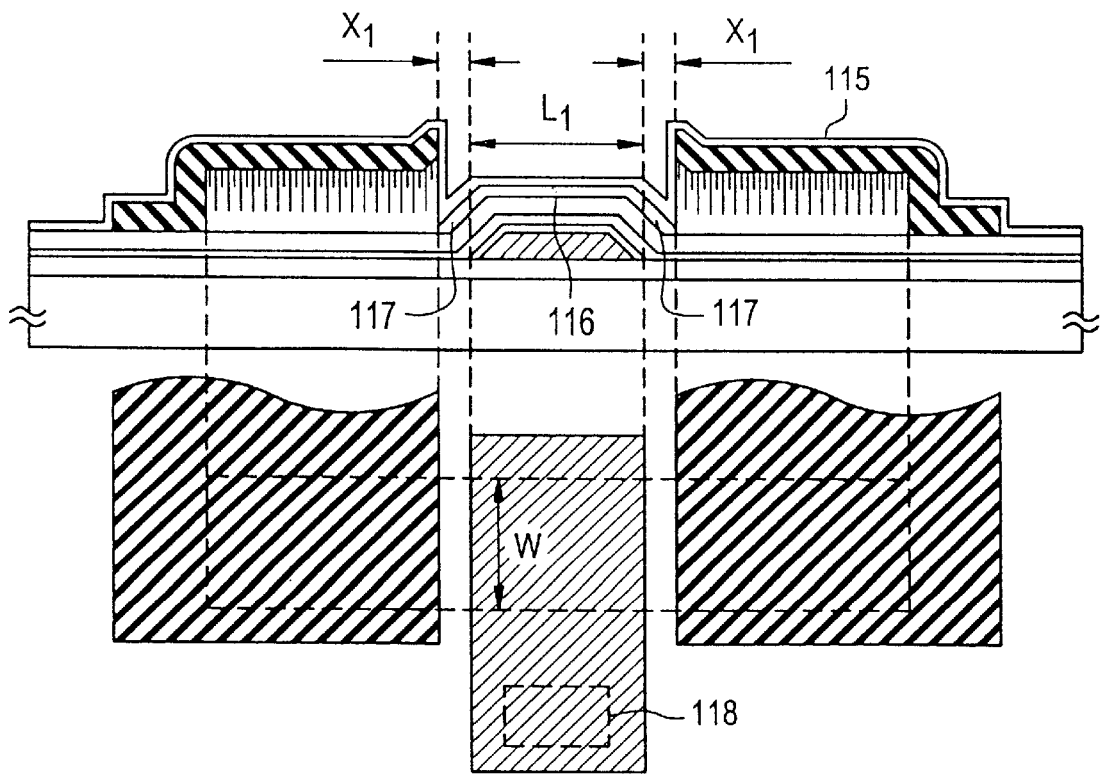

After the island semiconductor layer 111 has been thus etched (in the channel-etching step), a protective film 115 of a silicon oxide film or a silicon nitride film is formed over this to obtain an inverse stagger-type TFT having the structure shown in FIG. 2C.

In that condition, the region of the channel-etched, island semiconductor layer 111 that is positioned just above the gate electrode 112 is a channel-forming region 116. In the constitution in this Embodiment, the width of the gate electrode corresponds to the length of the channel-forming region, and the length represented by $L^1$ is referred to as a channel length. The regions 117 positioned outside the edges of the gate electrode 103 are outside the electric field of the gate electrode 103, and are offset regions. The length of the regions 117 is represented by $X^1$.

In this Embodiment, the line width of the gate electrode 103 (this corresponds to $L^1$) is about 2.8_m in consideration of the anodic oxidation loss that gave the oxide film of 100 nm thick, and the length ($C^1$) of the channel-etching region 114 is 4_m. In this, therefore, the length ($X^1$) of each offset region is about 0.6_m.

Figure 3:
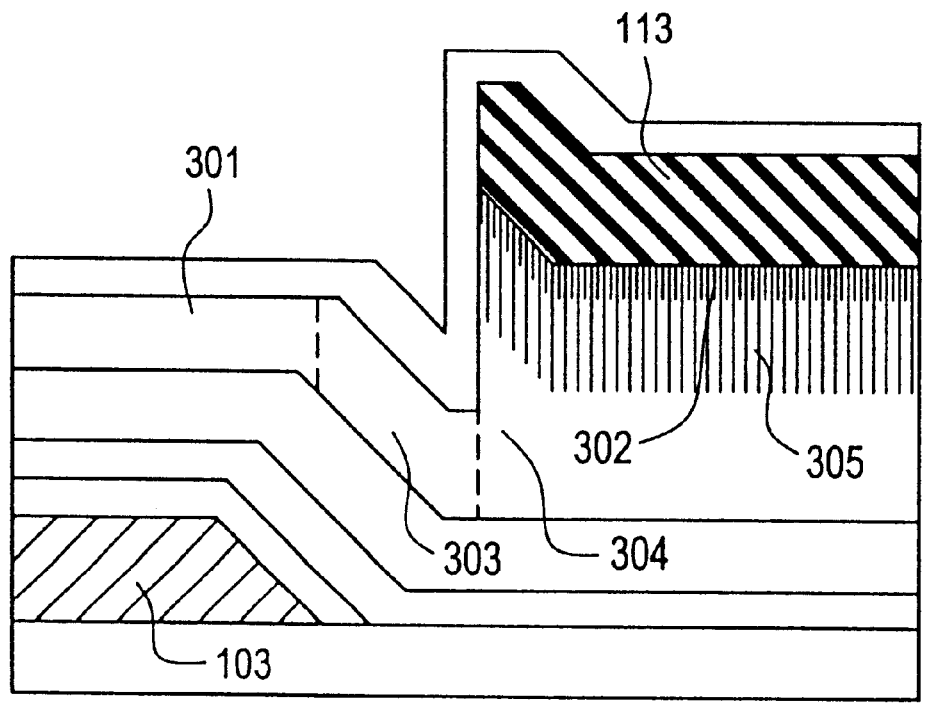
FIG. 3 is an enlarged view showing the constitution of the thin film transistor in Embodiment 1.

An enlarged view of the drain region (the semiconductor layer contacted with the drain electrode 113) is shown in FIG. 3. In FIG. 3, 103 is the gate electrode, 301 is the channel-forming region, 302 is the n⁺ layer (source or drain electrode), 303 and 304 are the offset regions each having a different thickness, and 305 is the n⁻ layer (LDD region).

Though not shown herein, the source region (the semiconductor layer contacted with the source electrode 112) has the same structure as above.

The TFT structure is graphically drawn in FIG. 3, in which special attention should be paid to the relationship between the thicknesses of the regions constituting the structure. In the most preferred constitution of the present invention, the constituent regions satisfy the condition that the thickness of the n⁺ layer 302<that of the n⁻ layer 305<that of the offset region (i-layer) 304.

This is because the n⁺ layer 302 functions only as an electrode and may be thin. On the other hand, the n⁻ layer 305 and the offset region 304 should be satisfactorily thick for effective field relaxation.

In the constitution of this Embodiment, the two offset regions 303 and 304 each having a different thickness, and the LDD region 305 exist between the channel-forming region 301 and the n⁺ region 302. In this, the region 303 is an offset region in the in-plane direction, which is formed by mask alignment, and this is referred to as a mask offset region.

The region 304 is an offset region in the direction of the thickness of the film, and its thickness corresponds to the thickness of the i-layer. This is referred to as a thickness offset region. The thickness of the thickness offset region 304 may fall between 100 and 300 nm (typically between 150 and 200 nm). However, this must be larger than the thickness of the channel-forming region. If its thickness is smaller than the thickness of the channel-forming region, the thickness offset region 304 could not exhibit good offsetting ability.

We, the present inventors refer to the structure of that type comprising offset+LDD, as an HRD (high resistance drain) structure, and differentiate it from ordinary LDD structures. In this Embodiment, the HRD structure is a three-stage structure comprising mask offset+thickness offset+LDD.

In this case, the LDD region 305 is controlled by its thickness and the impurity concentration therein, and therefore has the advantage of high reproducibility and uniform characteristics. Contrary to this, the LDD region as formed by conventional patterning has the problem of non-uniform characteristics to be caused by the patterning error, as so mentioned hereinabove with reference to the prior art.

As being controlled by the patterning, the length ($X^1$) of the mask offset region 303 is influenced by the patterning error and even by the glass shrinkage error. However, since the region 303 is followed by the thickness offset region 304 and the LDD region 305, the influence of the error on the length of the region 303 is thereby reduced and the fluctuation in the characteristics of the region 303 may be reduced.

The length ($X^1$) of the mask offset region 303 may be represented by $(C^1-L^1)/2$ where $L^1$ indicates the channel length and $C^1$ indicates the length of the channel-etching region. Accordingly, the intended offset length ($X^1$) can be defined in the patterning step of forming source/drain electrodes. In the constitution of this Embodiment, the offset length ($X^1$) may be from 0.3 to 3_m (typically from 1 to 2_m).

The inverse stagger-type TFT having the structure shown in FIG. 2C could not be realized in any prior art of TFT having conventional amorphous silicon films as the active layers (island semiconductor layers). This is because, in the case of TFT comprising such an amorphous silicon film, if the source/drain electrodes are not so constructed as to overlap with the gate electrode, the carrier (electron or hole) mobility is extremely low.

Even if the source/drain electrodes are so constructed as to overlap with the gate electrode in TFT comprising an amorphous silicon film, the mobility (field effect mobility) of those TFT will be at most from 1 to 10 cm²/Vs or so. Contrary to this, if TFT comprising an amorphous silicon film are constructed like in the present Embodiment, their mobility is too low to function as switching devices.

As opposed to those conventional TFT, the TFT of the present invention comprises crystalline silicon films as the active layers, and the carrier mobility therein is fully high. Therefore, the structure of this Embodiment ensures a satisfactorily high carrier mobility. In other words, using the semiconductor films having a crystalline structure as the active layers realizes the TFT structure of this Embodiment.

Since the inverse stagger-type TFT of this Embodiment has the HRD structure, it is highly resistant to hot carrier implantation to be caused by impact ionization, and therefore has high reliability. In addition, in the TFT of this Embodiment, the LDD region is formed in a well controlled manner and governs the other regions. Therefore, the characteristics of the TFT vary little.

Accordingly, the structure of this Embodiment is favorable to TFT circuits that are required to have high voltage resistance but not so quick operating mobility.

As is known from the process of this Embodiment, only 4 masks are used to produce the inverse stagger-type TFT having the structure of FIG. 2C. Considering the fact that conventional channel-stop-type TFT require 6 masks, the structure of this Embodiment means significant improvements in the throughput and the yield of inverse stagger-type TFT.

As in the above, using the structure of this Embodiment makes it possible to produce bottom-gate-type TFT of high reliability and high producibility on a mass-production scale.

The bottom-gate-type TFT (N-channel-type TFT) as produced according to the process of this Embodiment realize a mobility of from 10 to 150 cm²/Vs (typically from 60 to 120 cm²/Vs) and a threshold voltage of from 1 to 4 V.

Embodiment 2

This is to demonstrate another embodiment of the invention, which is different from Embodiment 1. The basic process of producing TFT in this Embodiment 2 is the same as that in Embodiment 1. The differences of Embodiment 2 from Embodiment 1 are described herein.

Figure 5A:
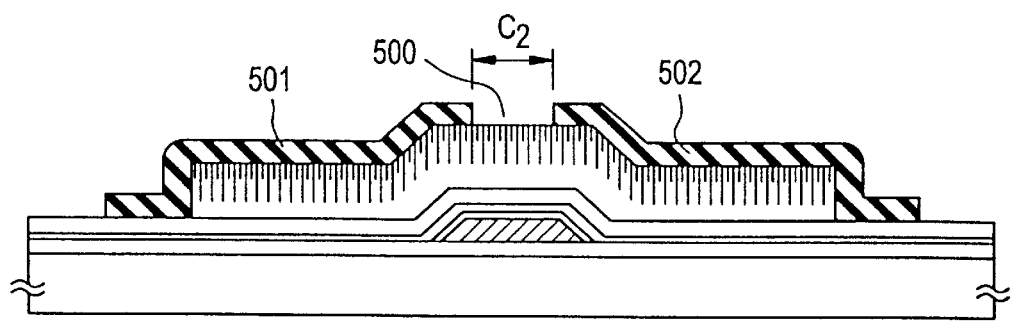
FIG. 5A to FIG. 5C show the constitution of a thin film transistor in Embodiment 2.
Figure 5B:
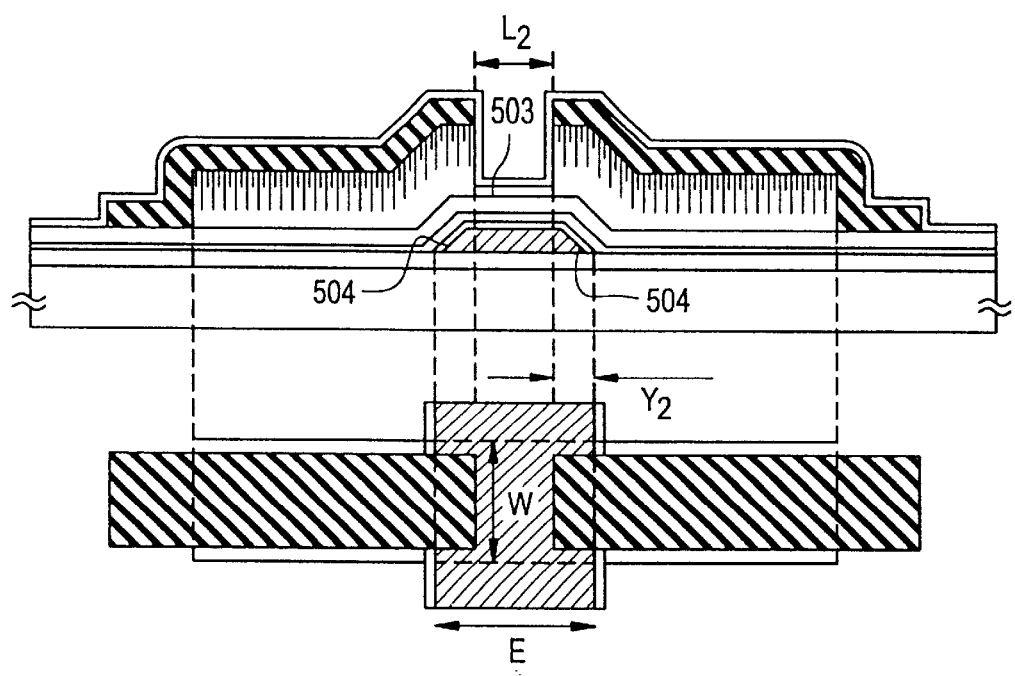

First prepared is the structure of FIG. 5A according to the process of Embodiment 1.

The difference between the structure herein and that in Embodiment 1 is that the length of the channel-etching region 500 to be between the source electrode 501 and the drain electrode 502 is $C^2$ herein. In this, $C^2$ is narrower than the width of the gate electrode, and may fall between 2 and 9_m (typically between 2 and 4_m). Specifically, this Embodiment is characterized in that the gate electrode overlaps with the source/drain electrodes.

This structure of FIG. 5A is subjected to the channel-etching step as in Embodiment 1, and then coated with protective films. Thus is formed the structure of FIG. 5B. In this, the region indicated by 503 is a channel-forming region, and the channel length is indicated by $L^2$ (=$C^2$). By suitably designing the masks, the length ($Y^2$) of the over-lapping regions (hereinafter referred to as mask-overlapping regions) is controlled to be $(E-L^2)/2$ where E is the width of the gate electrode.

Figure 5C:
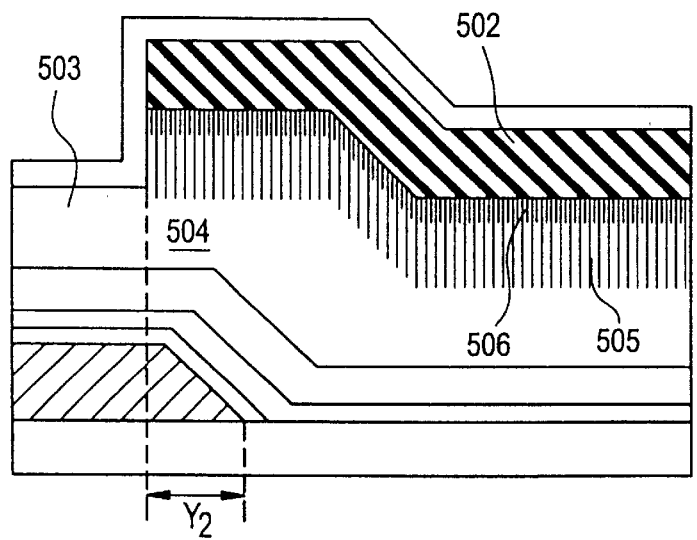

FIG. 5C is an enlarged view of the drain region, in which the carriers pass through the channel-forming region 503 (thickness: 50 nm), the mask-overlapping region 504 (thickness: 160 nm) and the LDD region 505 (thickness: 50 nm) and reach the n⁺ layer 506 (thickness: 40 nm) and the drain electrode 502, while the TFT is driven.

In this structure, the electric field from the gate electrode covers the mask-overlapping region 504, but is attenuated toward the LDD region 505. In this, therefore, the region 504 has substantially the same function as that of the LDD region. Needless-to-say, the region 504 nearest to the LDD region 505 is entirely free from the influence of the electric field, and this functions also as an offset (thickness offset) region.

In this Embodiment, the HRD structure having the mask-overlapping region is comprising overlapping substantial LDD+thickness offset+impurity-poor LDD. In the HRD structure in which the mask-overlapping region 504 is thin, the LDD region may be comprising overlapping substantial LDD+impurity-poor LDD.

In the structure of this Embodiment, the overlapping region 504 and the LDD region 505 each are well controlled to have a controlled thickness. Therefore, the characteristics of TFT having this structure vary little. The length ($Y^2$) of each overlapping region may contain a patterning error. However, since the overlapping LDD, the thickness offset and the impurity-poor LDD are not influenced by the patterning error, the length error of $Y^2$ has few negative influences on the characteristics of TFT.

The structure of this Embodiment has a reduced offset component and is favorable to TFT circuits that are required to have quick operating mobility.

Another advantage of the structure of this Embodiment is that minor carriers having accumulated in the channel-forming region due to impact ionization can rapidly move to the source electrode without causing substrate floatation. Therefore, using the structure of this Embodiment realizes TFT that ensure quick operating motion and have high voltage resistance.

Embodiment 3

This is to demonstrate still another embodiment of the invention, which is different from Embodiments 1 and 2. The basic process of producing TFT in this Embodiment 3 is the same as that in Embodiment 1. The differences of Embodiment 3 from Embodiment 1 are described herein.

Figure 6A:
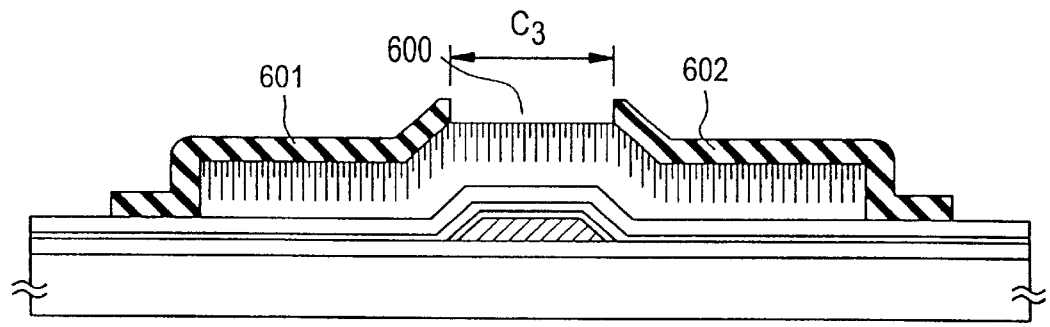
FIG. 6A to FIG. 6C show the constitution of a thin film transistor in Embodiment 3.
Figure 6B:
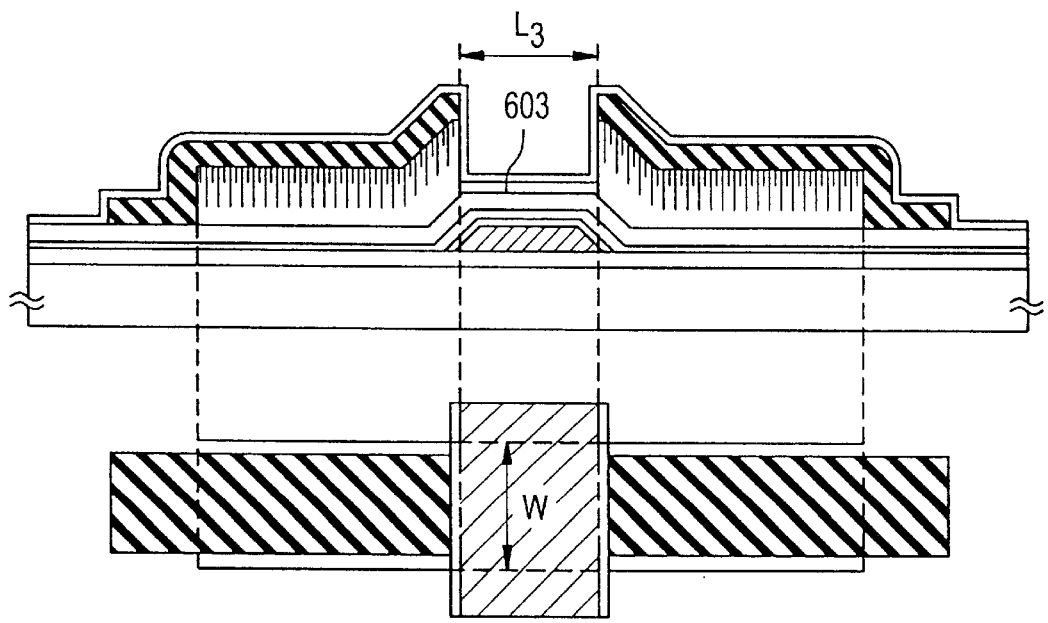

First prepared is the structure of FIG. 6A according to the process of Embodiment 1. The difference between the structure herein and that in Embodiment 1 is that the length of the channel-etching region 600 to be between the source electrode 601 and the drain electrode 603 is $C^3$ herein. In this, $C^3$ is the same as the width of the gate electrode, and may fall between 1 and 10_m (typically between 3 and 5_m).

This structure of FIG. 6A is subjected to the channel-etching step as in Embodiment 1, and then coated with protective films. Thus is formed the structure of FIG. 6B. In this, the region indicated by 603 is a channel-forming region, and the channel length is indicated by $L^3$ (=$C^3$).

Figure 6C:
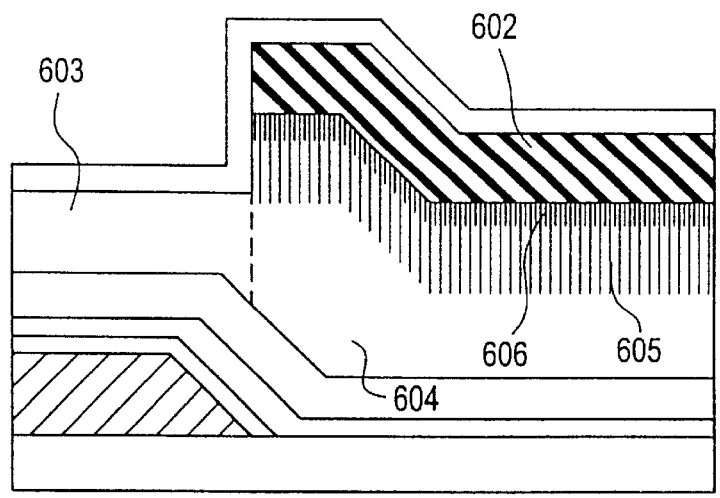

FIG. 6C is an enlarged view of the drain region, in which the carriers pass through the channel-forming region 603 (thickness: 100 nm), the thickness offset region 604 (thickness: 150 nm) and the LDD region 605 (thickness: 100 nm) and reach the $n^+$ layer 606 (thickness: 50 nm) and the drain electrode 602, while the TFT is driven. In this Embodiment, the HRD structure has a two-stage structure of offset+LDD.

In the structure of this Embodiment, the thickness offset region 604 and the LDD region 605 each are well controlled to have a controlled thickness. Therefore, the characteristics of TFT having this structure vary little. In addition, the voltage resistance of TFT having this structure is high.

Embodiment 4

This is to demonstrate still another embodiment of the invention, which is different from Embodiments 1 to 3. The basic process of producing TFT in this Embodiment 4 is the same as that in Embodiment 1. The differences of Embodiment 4 from Embodiment 1 are described herein.

Figure 7A:
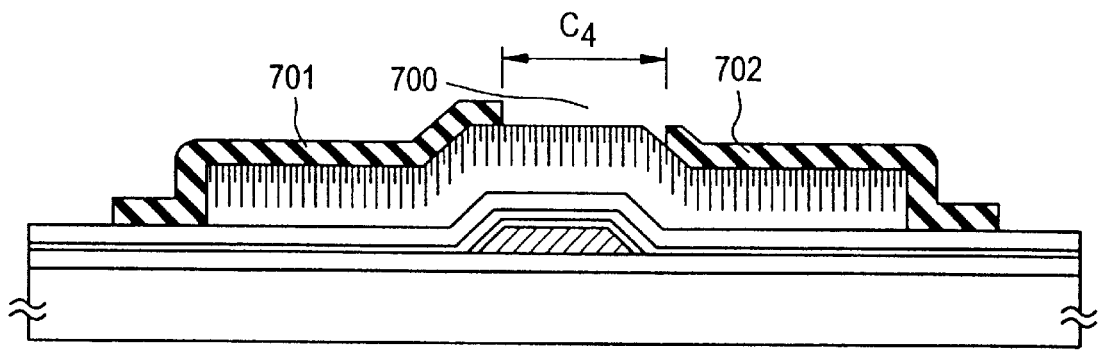
FIG. 7A and FIG. 7B show the constitution of a thin film transistor in Embodiment 4.
Figure 7B:
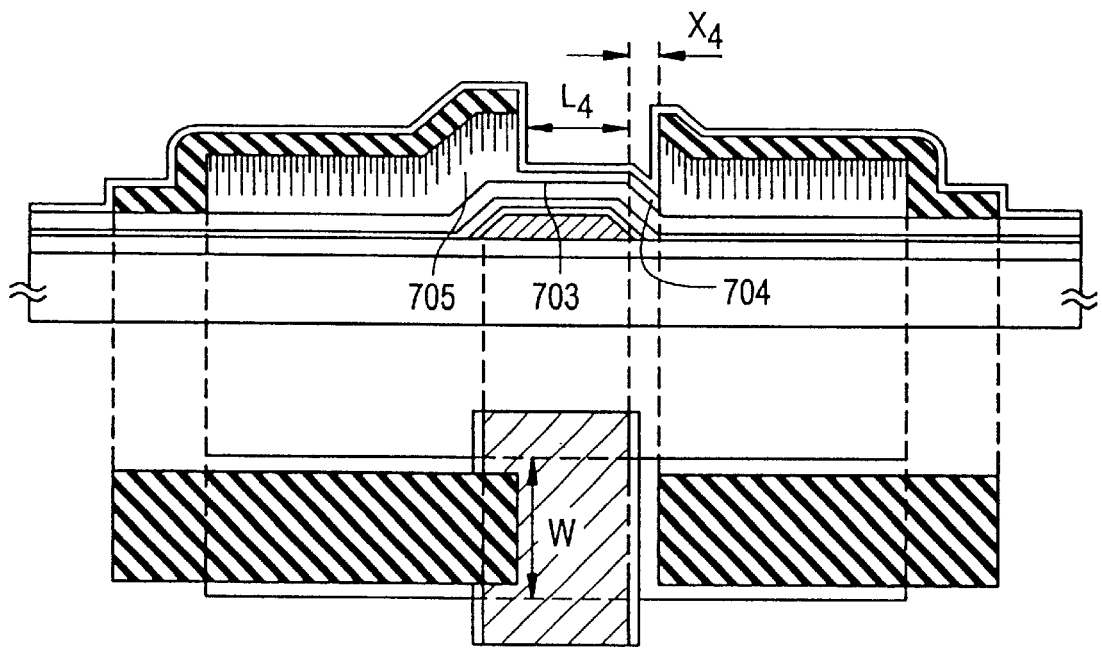

First prepared is the structure of FIG. 7A according to the process of Embodiment 1. The difference between the structure herein and that in Embodiment 1 is that any one of the source electrode 701 or the drain electrode 702 overlaps with the gate electrode while the other does not.

In this Embodiment, the length of the channel-etching region 700 is $C^4$, which may fall between 1 and 10_m (typically between 3 and 6_m).

This structure of FIG. 7A is subjected to the channel-etching step as in Embodiment 1, and then coated with protective films. Thus is formed the structure of FIG. 7B. In this, the region indicated by 703 is a channel-forming region, and the channel length is indicated by $L^4$ (=$C^4$–$X^4$).

In this, $X^4$ indicates the length of the mask offset region 704. For the numerical limitation of $X^4$, referred to is Embodiment 1. For the numerical limitation of the length of the mask-overlapping region 705, referred to is Embodiment 2.

The structure of this Embodiment comprises a combination of the HRD structure of Embodiment 1 and the HRD structure (or LDD structure) of Embodiment 2. For the details of the constituent structures herein, referred to are those in Embodiments 1 and 2.

In this Embodiment, it is desirable that the source region has the HRD structure (or LDD structure) of Embodiment 2 while the drain region has the HRD structure of Embodiment 1.

The electric field concentration is great in the channel edge (junction) adjacent to the drain region. Therefore, for example, it is desirable that the drain region in this Embodiment has the resistance component-rich HRD structure as in Embodiment 1. On the contrary, the source region in this Embodiment is not required to have such high voltage resistance. To the source region herein, therefore, the resistance component-poor HRD (or LDD) structure as in Embodiment 2 is favorable.

In this Embodiment, any one of the source/drain regions may be combined with the structure of Embodiment 2. In any manner, producers may suitably select any of HRD and LDD structures such as those illustrated in Embodiments 1 to 3 to construct various types of source/drain regions and to design and produce optimum structures of TFT circuits comprising the thus-constructed source/drain regions. In that case, various patterning of $3^2$=9 combinations is available.

Embodiment 5

Figure 8:
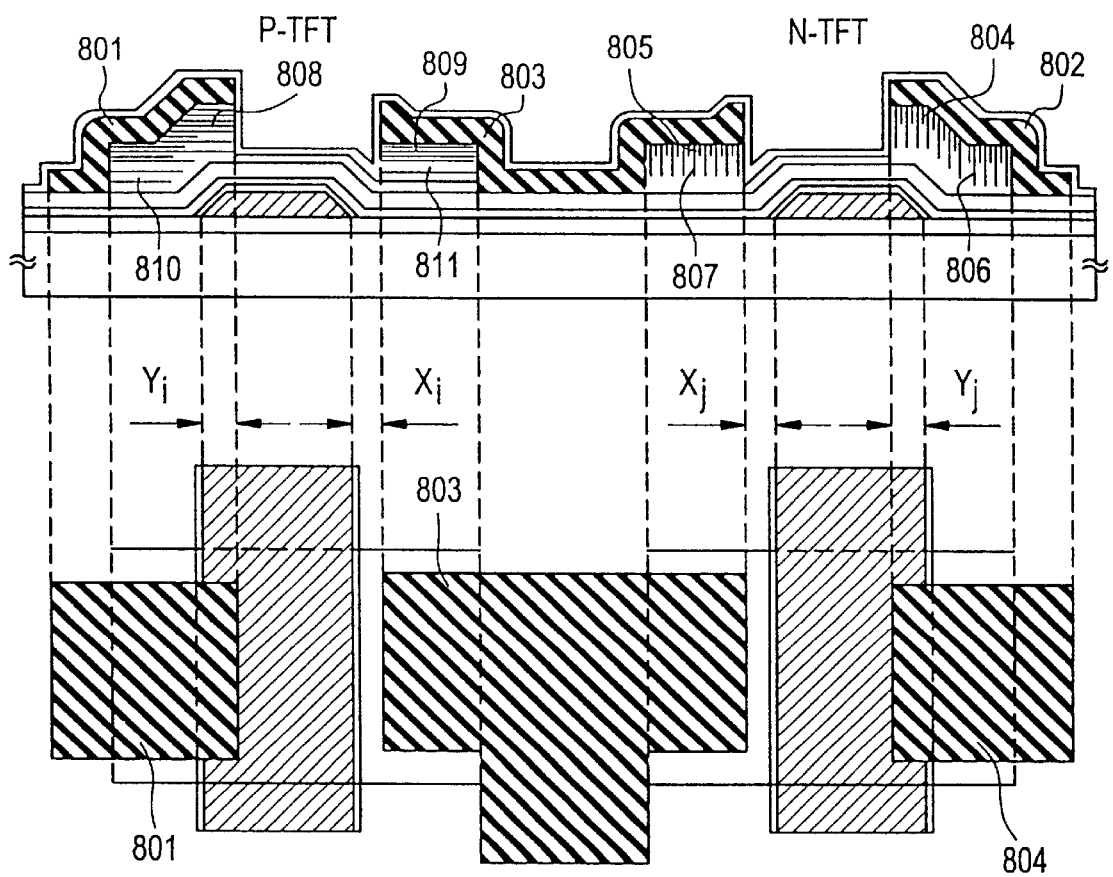
FIG. 8 shows the constitution of a CMOS circuit in Embodiment 5.

This is to demonstrate the construction of a CMOS circuit (inverter circuit) comprising the bottom-gate-type TFT having the constitution of any of Embodiments 1 to 4, with reference to FIG. 8. The CMOS circuit is comprising N-channel-type TFT and P-channel-type TFT as complementarily formed and combined on one substrate.

The CMOS circuit illustrated in FIG. 8 comprises the structure of Embodiment 4, in which 801 is a source electrode for a P-channel-type TFT, 802 is a source electrode for an N-channel-type TFT, and 803 is a drain electrode for both the N/P TFT.

The N-channel-type TFT comprises $n^+$ layers 804 and 805 and $n^-$ layers 806 and 807 all formed according to the process of Embodiment 1. On the other hand, the P-channel-type TFT comprises $p^{++}$ layers 808 and 809 and $p^-$ layers 810 and 811.

It is extremely easy to form the CMOS circuit on one substrate. In the case of the present invention, the structure of FIG. 2A is first prepared according to the process of Embodiment 1.

Irrespective of N/P types, an element selected from Group 15 is added to the entire surface of this structure. To produce the P-channel-type TFT in this structure, the region to be the N-channel-type TFT is masked with a resist mask or the like, and an element selected from Group 13 (typically boron, indium or gallium) is added to this.

In this Embodiment, boron is added to produce the P-channel-type TFT. In this case, the dose of boron must be higher than the phosphorus concentration by which the type of the conductivity of the intended region is inverted. In order to completely convert all the $n^+$ layer and the $n^-$ layer to the $p^{++}$ layer and the $p^-$ layer, the concentration profile in boron addition must be so controlled that the boron depth is larger than the phosphorus depth.

Figure 9:
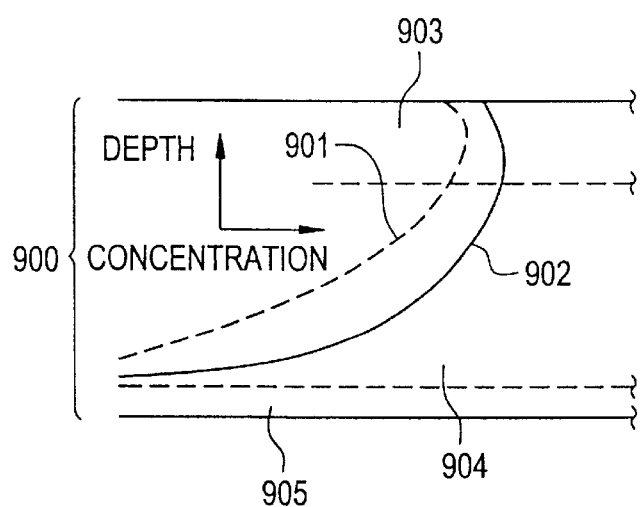
FIG. 9 is a graph showing impurity concentration profiles in a semiconductor film in Embodiment 5.

Accordingly, the boron concentration profile in the film is as in FIG. 9. In FIG. 9, 900 is a semiconductor film, 901 is a phosphorus concentration profile prior to boron addition, 902 is a boron concentration profile after boron addition, 903 is a $p^{++}$ layer, 904 is a p– layer, and 905 is an i-layer.

In this case, the $p^{++}$ layer has a thickness of from 10 to 150 nm (typically from 50 to 100 nm), and the boron concentration in the $p^{++}$ layer is so controlled that it falls between $3\times10^{19}$ and $1\times10^{22}$ atoms/cm$^3$, but typically between $3\times10^{19}$ and $3\times20^{21}$ atoms/cm$^3$.

On the other hand, the $p^-$ layer has a thickness of from 30 to 300 nm (typically from 100 to 200 nm), and the boron concentration in the $p^-$ layer is so controlled that it falls between $5\times10^{17}$ and $3\times10^{19}$ atoms/cm$^3$. However, since the P-channel-type TFT naturally has high durability, the formation of the $p^-$ layer for the LDD region is not always necessary. The reason why the thickness of the $p^-$ layer 904 is specifically referred to herein is because the $p^-$ layer is all the time formed in the ion implantation for boron addition that brings about the continuously varying boron concentration profile.

In this Embodiment, both the N-channel-type TFT and the P-channel-type TFT have the HRD structure (comprising overlapping regions) of Embodiment 2 in their source regions, while having the HRD structure (comprising mask offset regions) of Embodiment 1 in their drain regions.

Accordingly, as will be obvious from the top view of FIG. 8, the source region in the P-channel-type TFT has an overlapping region having a length of Yi, while the drain region therein has a mask offset region having a length of Xi. On the other hand, the source region in the N-channel-type TFT has an overlapping region having a length of Yj, while the drain region therein has a mask offset region having a length of Xj.

In this case, the lengths of Xi, Xj, Yi and Yj can freely be varied depending on mask designing. Accordingly, each length of those may be suitably determined in accordance with the necessity for the circuit constitution, and it is not always necessary to unify the lengths in the N-channel-type and P-channel-type TFT.

In the CMOS circuit having the structure illustrated herein, the voltage resistance of the region to be the common drain is high. Therefore, the structure of the illustrated type is extremely useful in constructing circuits for high operating voltage.

FIG. 8 shows the constitution of the CMOS circuit comprising TFT of Embodiments 1 to 4. Needless-to-say, however, any other combinations except the illustrated constitution are acceptable. Nine combinations are available for one TFT. Therefore, $9^2=81$ modifications or variations are acceptable for patterning constitution of one CMOS circuit. From those plural combinations. the optimum ones may be selected and employed in accordance with the necessary properties of the circuits to be produced.

As has been illustrated in this Embodiment, the present invention is easily applicable to P-channel-type TFT. In that case, the bottom-gate-type TFT (P-channel-type TFT) of the invention realize a mobility of from 10 to 100 cm$^2$/Vs (typically from 50 to 100 cm$^2$/Vs) and a threshold voltage of from –1.5 to –5 V.

Embodiment 6

This is to demonstrate one embodiment of the means of controlling the threshold voltage of TFT of the invention.

For threshold voltage control, an element selected from Group 13 (typically boron, indium, gallium) or Group 15 (typically phosphorus, arsenic, antimony) may be added to a channel-forming region. This technique is referred to as channel doping.

The technique of channel doping is effective in the present invention, for which any of the following two methods is preferred as being simple.

The first method comprises adding a gas that contains an impurity for threshold voltage control (e.g., diborane, phosphine, etc.) to the film forming gas for the amorphous silicon film. In this method, the formed film contains a predetermined amount of the impurity. This method does not require any additional step for impurity addition. However, in this method, both the N-type and P-type TFT have the same impurity concentration. Therefore, this method is not available for the case where the N-type and P-type TFT have a different impurity concentration.

The second method comprises adding an impurity selectively to the channel-forming region (or to the channel-forming region and the mask offset region) via the source/drain electrodes acting as masks, after the channel-etching step (for forming the channel-forming region) as in FIG. 2C.

For this, available is any of ion implantation, ion doping, plasma processing, gaseous phase addition (for impurity diffusion from gaseous atmosphere), solid phase addition (for impurity diffusion from solid film) and the like. Since the channel-forming region is thin, gaseous phase addition, solid phase addition and the like that cause no damage to the region are preferred.

In ion implantation, it is desirable to cover the entire surface of TFT with a protective film, by which the channel-forming region is protected from being damaged.

After the impurity has been added to the film, it is activated through laser annealing, lamp annealing, furnace annealing or their combination. In this step, the damage of the channel-forming region is almost completely recovered.

In this Embodiment, the concentration of the impurity for threshold voltage control, which is added to the channel-forming region, may fall between $1\times10^{15}$ and $5\times10^{18}$ atoms/cm$^3$ (typically between $1\times10^{15}$ and $5\times10^{17}$ atoms/cm$^3$).

The threshold voltage of the N-channel-type TFT of the invention, to which the embodiment of this Embodiment has been applied, may fall between 1.5 and 3.5 V. The threshold voltage of the P-channel-type TFT of the invention, to which the same has been applied, may fall between –1.5 and –3.5 V.

The constitution of this Embodiment may be combined with any constitution of Embodiments 1 to 5. Where it is combined with the CMOS circuit of Embodiment 5, the type of the impurity and even the concentration thereof may be changed in the N-type TFT and the P-type TFT.

Embodiment 7

The structure of FIG. 2C has the source electrode 112 and the drain electrode 113 that entirely surround the island semiconductor layer. This Embodiment is to demonstrate a structure partly different from the structure of FIG. 2C.

Figure 10A:
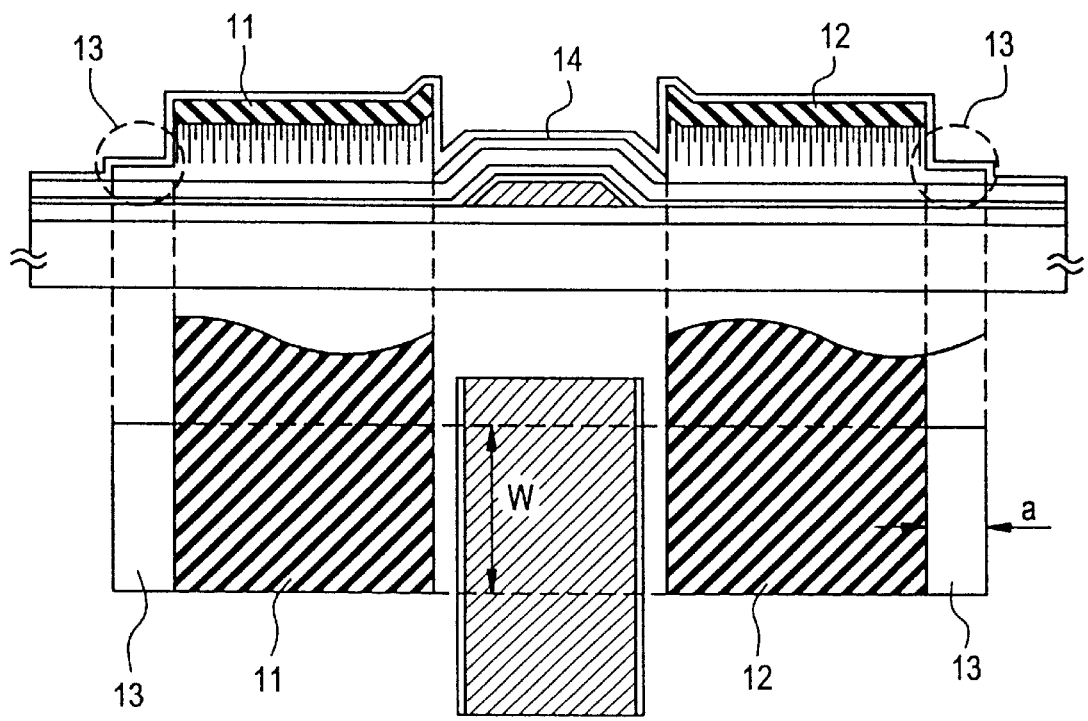
FIG. 10A and FIG. 10B shows the constitution of a thin film transistor in Embodiment 7.

Referred to is the structure of FIG. 10A, which is basically the same as the structure of FIG. 2C but is partly different from it. The structure of FIG. 10A is characterized in that the shape of the source electrode 11 and that of the drain electrode 12 differ from those in FIG. 2C. Specifically, in the structure of FIG. 10A, the source electrode 11 and the drain electrode 12 are formed partly inside the island semiconductor layer (strictly, inside the source/drain regions) by the distance of "a".

The region indicated by 13 has a thickness that is the same as the thickness of the channel-forming region 14, and has a width that is the same as the distance of "a". Though graphically shown in the drawing, the distance "a" is from 1 to 300_m (typically from 10 to 200_m).

The characteristics of this Embodiment will be mentioned below, with reference to the process of producing the structure of this Embodiment. As in FIG. 10B, the source electrode 11 and the drain electrode 12 are formed herein. In this, the edges 16 of an island semiconductor layer 15 are exposed outside.

Figure 10B:
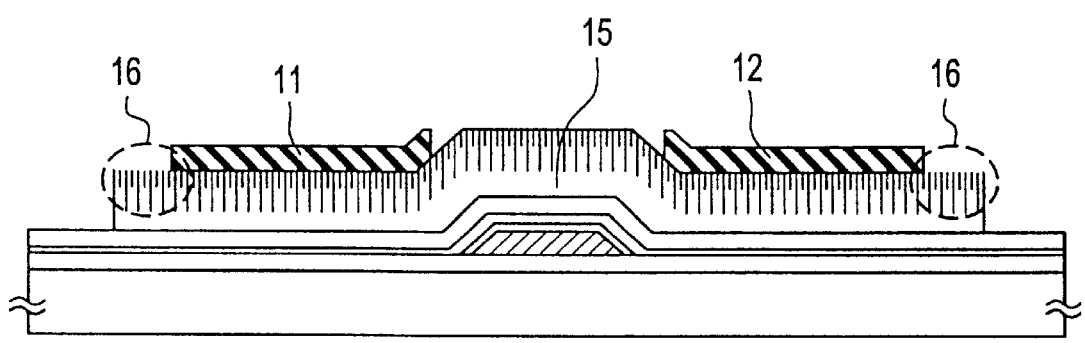

The structure of FIG. 10B is subjected to a channel-etching step, where the island semiconductor layer 15 is self-alignedly etched via the source electrode 11 and the drain electrode 12 both acting as masks. In this, the edges 16 are also etched.

As a result of the etching, obtained is the structure of FIG. 10A. In the thus-obtained structure, it is obvious that the thickness of the edges 16 is the same as that of the channel-forming region 14.

In this Embodiment, the protrusions 13 of the island semiconductor layer are formed for the following two reasons.

These are used for etching monitoring in the channel-etching step.

In the subsequent steps of forming a protective film and an interlayer insulating film, these protrusions are effective for reducing the coverage failure to be caused by the height of the island semiconductor layer.

For the etching monitoring, the products being produced are sampled and the samplings are inspected at their protrusions to check the etching degree at the channel-forming region.

The structure of this Embodiment may be combined with any structure of Embodiments 1 to 6.

Embodiment 8

Figure 11A:
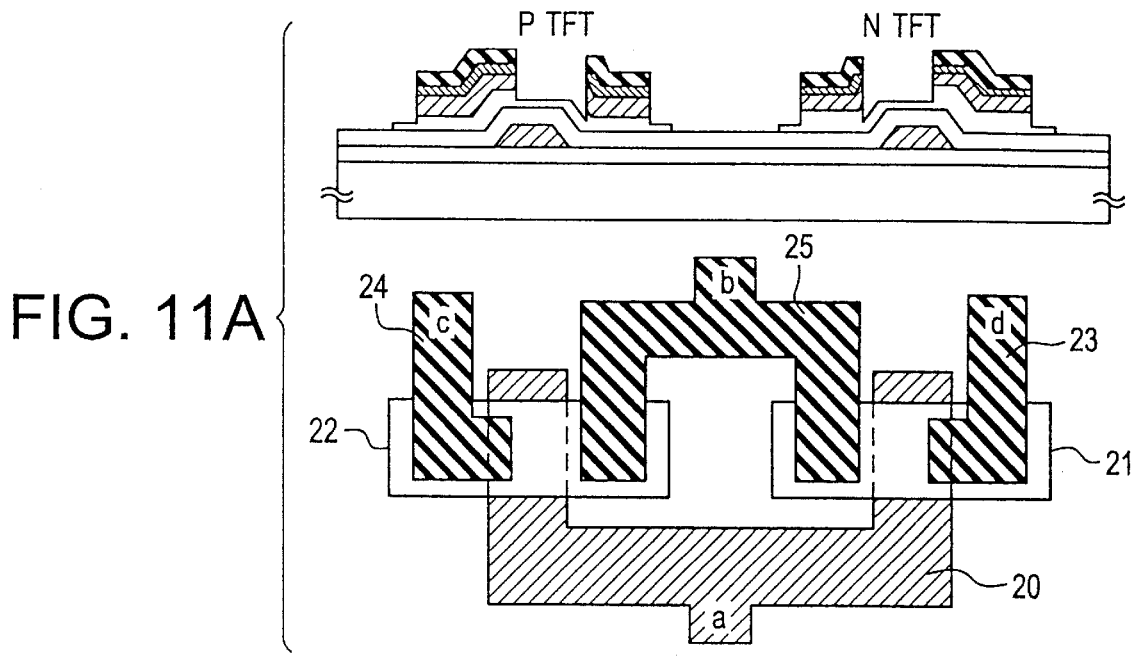
FIG. 11A to FIG. 11C show the constitution of a CMOS circuit in Embodiment 8.
Figure 11B:
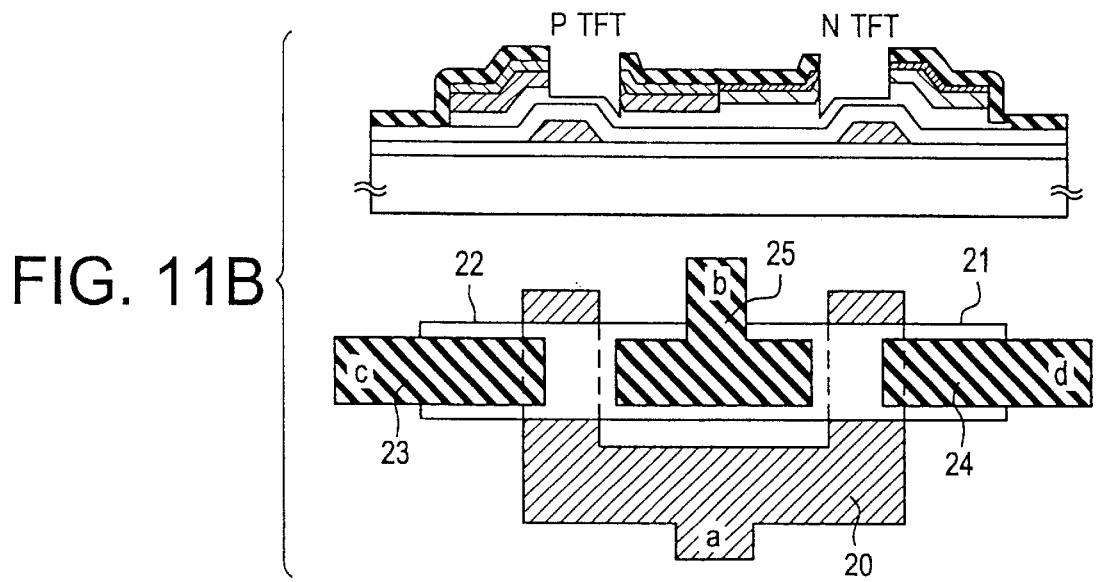
Figure 11C:
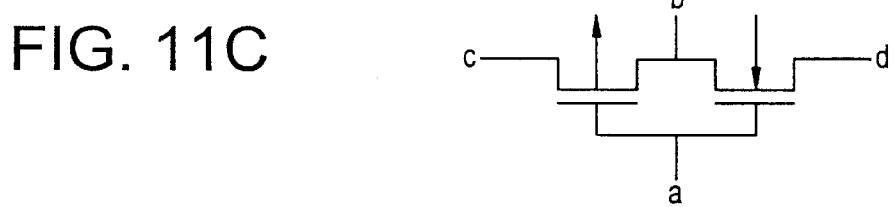

This is to demonstrate one embodiment of the circuit constitution of the CMOS circuit (inverter circuit) of Embodiment 5, with reference to FIG. 11A to FIG. 11C.

FIG. 11A shows a CMOS circuit of which the structure is the same as that in FIG. 8. The CMOS circuit illustrated comprises a gate electrode 20, an N-type TFT semiconductor layer 21, a P-type TFT semiconductor layer 22, an N-type TFT source electrode 23, a P-type TFT source electrode 24 and a common drain electrode 25.

The terminals, a, b, c and d correspond to those of a, b, c and d, respectively, of the inverter circuit shown in FIG. 11C.

FIG. 11B shows a modification of the CMOS circuit, in one and the same semiconductor layer of the drain region is formed for both the N-type TFT and the P-type TFT. The numeral and code references in FIG. 11B correspond to those in FIG. 11A.

In the structure of FIG. 11B, all TFT can be formed at an extremely high density. Therefore, this structure is extremely effective in producing large-scale integration circuits. In this, the common semiconductor layer will form PN junctions, which, however, produce no problem.

Embodiment 9

In Embodiment 1, the amorphous semiconductor film is crystallized with laser beams, especially with pulse-oscillation excimer laser beams for fusion crystallization. In this, laser beams or intense light of which the intensity is equivalent to laser beams can be used for crystallizing the amorphous semiconductor film through solid phase crystal growth, without distorting the glass substrate.

As the light source for generating such intense light or laser beams, usable is any of IR lamps such as halogen lamps, or continuous oscillation lasers such as Ar lasers. RTA (rapid thermal annealing) for which are used IR lamps or continuous oscillation lasers ensures crystallization of amorphous semiconductor films under heat for a few seconds to tens seconds, and therefore realizes great improvements in throughput.

Where amorphous semiconductor (e.g., silicon) films are exposed to light from IR lamps or to continuous oscillation laser beams, the light absorbed by the films is converted into heat, and the thus-generated heat acts on the films to form crystal nuclei therein. In those films, the nuclei grow in the solid phase, resulting in that the films are converted into crystalline semiconductor films.

Where a halogen lamp (peak wavelength: 1.15_m, wavelength range: 0.4 to 4_m) is used, the heating time may fall between 10 and 60 seconds, but typically between 15 and 30 seconds. With this, amorphous semiconductor films are heated at 700 to 1000_C. In this case, even through the films are heated at 700 to 1000_C, the underlying glass substrate is not heated over its distortion point (650 to 700_C or so), since the glass substrate hardly absorbs IR rays and since the exposure time is short.

After amorphous semiconductor films have been crystallized with IR lamps or continuous oscillation laser beams, it is desirable that the resulting crystalline semiconductor films are further exposed to laser beams for annealing to thereby increase the degree of crystallinity of the films. In this case, the annealing with laser beams may be performed for activating the impurity added to the films.

The RTA technique of this Embodiment for crystallizing semiconductor films may be combined with all other Embodiments illustrated herein.

Embodiment 10

This is to demonstrate the production of an active-matrix-type display device that comprises a driver circuit (peripheries-driving circuit) and a pixel matrix circuit as integrated on one substrate, with reference to the basic process of Embodiment 1.

In this Embodiment, the basic constitution of the driver circuit comprises a CMOS circuit (of the type illustrated in FIG. 11B). Apart from the driver circuit, the other information processing circuits of D/A converter circuit, memory circuit, correction circuit and others (these are differentiated from the driver circuit and will be referred to as logic circuits) may also comprise TFT of the invention. For those logic circuits, a CMOS circuit is the base circuit.

A multi-gate TFT is usable as the pixel matrix circuit. In this Embodiment, used is a double-gate structure for the pixel matrix circuit, which, however, is not limitative. Apart from this, any of a single-gate structure or a triple-gate structure is available.

According to the process of Embodiment 1, an amorphous silicon film was crystallized through laser irradiation to form the structure of FIG. 1B. This is in FIG. 12A.

In FIG. 12A, 30 is a glass substrate, 31 is a undercoating film, 32 is a PTFT gate electrode to be a CMOS circuit, and 33 is an NTFT gate electrode. In this, 34 and 35 are pixel TFT gate electrodes, and these are connected with each other in the site not shown in the drawing. As the material for the gate electrodes 32 to 35, used is an aluminum film (containing 2 wt. % Sc). To protect the gate electrodes from being thermally and physically damaged, aluminum oxide films 3000 and 3001 are formed through anodic oxidation around the gate electrodes 32 and 33 of the CMOS circuit, and the pixel TFT gate electrodes 34 and 35 are also coated with an aluminum oxide film 3002 as formed through anodic oxidation. The oxide films 3001 to 3002 are formed in the same manner as in Embodiment 1.

As the material for the gate electrodes, also available is any of metallic silicides and other metals of titanium, chromium or the like, in place of aluminum. For example, as a conductive film capable of being subjected to anodic oxidation, available is any of a laminate film comprising tantalum (Ta) and tantalum nitride (TaN), or a simple substance film of tantalum. On the surface of the electrodes of that type, an oxide film of $Ta^2O^5$ may be formed through anodic oxidation. As having higher heat resistance than an aluminum film, the laminate film of tantalum (Ta) and tantalum nitride (TaN) may be directly processed according to the process of the invention without forming an oxide film thereover through anodic oxidation.

Over the oxide films 3000 to 3002, formed are a silicon nitride film 36 and a silicon oxynitride film 37. In place of the silicon oxynitride film 37, a silicon oxide film may be formed. In the pixel TFT and the CMOS circuit, the laminate of the silicon nitride film 36 and the silicon oxynitride film 37 as formed over the oxide films 3000 to 3002 functions as a gate-insulating layer.

Over the silicon oxynitride film 37, formed is a crystalline silicon film 3003 through laser crystallization as in Embodiment 1.

Next, phosphorus is added to the structure of FIG. 12A, in which are formed an n$^+$ layer 38, an n$^-$ layer 39 and an i-layer 40 in the crystalline silicon film 3003, as in FIG. 12B. For the details of these layers, referred to is the description of Embodiment 1.

Next, boron, which is an element selected from Group 13, is added to the region to be the PTFT of the CMOS circuit through ion implantation or ion doping, while the area except this region is masked with a resist mask (not shown). In this Embodiment, the boron dose is three times the phosphorus dose in the previous step, by which are formed a p$^{++}$ layer 41 and a p$^-$ layer 42. In this step, the type of the ion to be doped and the accelerated voltage for the ion doping must be so controlled that an intrinsic or substantially intrinsic i-layer 40 may remain below the p$^-$ layer 42. For the details of the p$^{++}$ layer 41 and the p$^-$ layer 42, referred to is the description of Embodiment 5. (FIG. 12C)

Next, this is annealed with laser beams, by which the crystallinity of the crystalline silicon film 3003 having become partly amorphous due to the addition of phosphorus and boron thereto is improved. The laser annealing activates the impurities (phosphorus and boron) in the film 3003. Prior to this laser annealing, the film 3003 may be dehydrogenated through RTA to thereby prevent hydrogen bumping in the laser annealing step. (FIG. 12D)

Next, the crystalline silicon film 3003 is etched to form island semiconductor layers 43 and 44. In this step, contact holes are formed through the film 3003, through which a part of the gate wiring is connected with the electrodes to be formed in the next step (second wiring).

The laser annealing may be performed after the formation of the island semiconductor layers 43 and 44 of the crystalline silicon film.

Next, a thin conductive film is formed over the layers 43 and 44, and patterned to form source electrodes 45 (NTFT) and 46 (PTFT) and a common drain electrode 47 for the CMOS circuit. In the same manner, a source electrode 48 and a drain electrode 49 for the pixel TFT are formed. The electrode indicated by 50 functions only as a mask, and this is referred to as a mask electrode herein. (FIG. 13A)

The structure of FIG. 13A thus constructed is etched to form channel-forming regions 51 to 54. In this case, the driver circuit is so constructed that mask offset regions are formed adjacent to the drain regions only of the both TFT, while overlapping regions are formed adjacent to the both source regions.

In this, the pixel TFT is so constructed that mask offset regions are formed adjacent to the source electrode 48 and to the drain electrode 49, while an overlapping region is formed below the mask electrode 50.

In the pixel TFT, the source/drain regions are switched during charging and discharging for image information inputting. Therefore, the both edges of the TFT must have high voltage resistance. In this structure, if the concentration of the resistance components is too high in the area below the mask electrode 50, the switching motion of the device will be retarded. In order to evade this problem, it is desirable that an overlapping region is provided in this area to thereby facilitate the carrier movement therethrough.

This Embodiment is to demonstrate one embodiment which is considered to be the most preferred one, and is not limited to only the structure illustrated herein. Producers may select the optimum structure in combination with any of the structures of Embodiments 1 to 4, while taking the advantages of the structures of Embodiments 1 to 4 into consideration.

Next, a protective film 55 of a silicon oxynitride film having a thickness of 200 nm is formed over the structure of FIG. 13B, and this is further coated with an interlayer insulating film of an organic resin film. To form the organic resin film 56, available is any of polyimide, polyamide, polyimidamide or acrylic resin.

Next, a contact hole is formed through the interlayer insulating film 56, into which is formed a pixel electrode 57 of a transparent conductive film (typically ITO). Finally, this is hydrogenated to complete an active matrix substrate, as in FIG. 13C.

Next, a liquid crystal layer is put between the active matrix substrate produced herein and a counter substrate, according to a known cell-constructing method, to produce an active-matrix-type liquid crystal display device.

To produce the active matrix substrate of this Embodiment, seven patterning steps are necessary, which are as follows:

Gate electrode patterning.
boron-doped region patterning.
island semiconductor layer patterning.
Gate contact patterning.

Source/drain electrodes patterning.

ITO contact patterning.

ITO patterning.

As above, producing the active matrix substrate requires only a small number of masks. Therefore, the throughput of the display device comprising the substrate is greatly increased. In addition, any desired circuits can be freely designed and formed on the substrate while using the TFT of Embodiments 1 to 5. Therefore, according to the technique of this Embodiment, display devices of high reliability and high reproducibility are easy to realize.

Figure 14A:
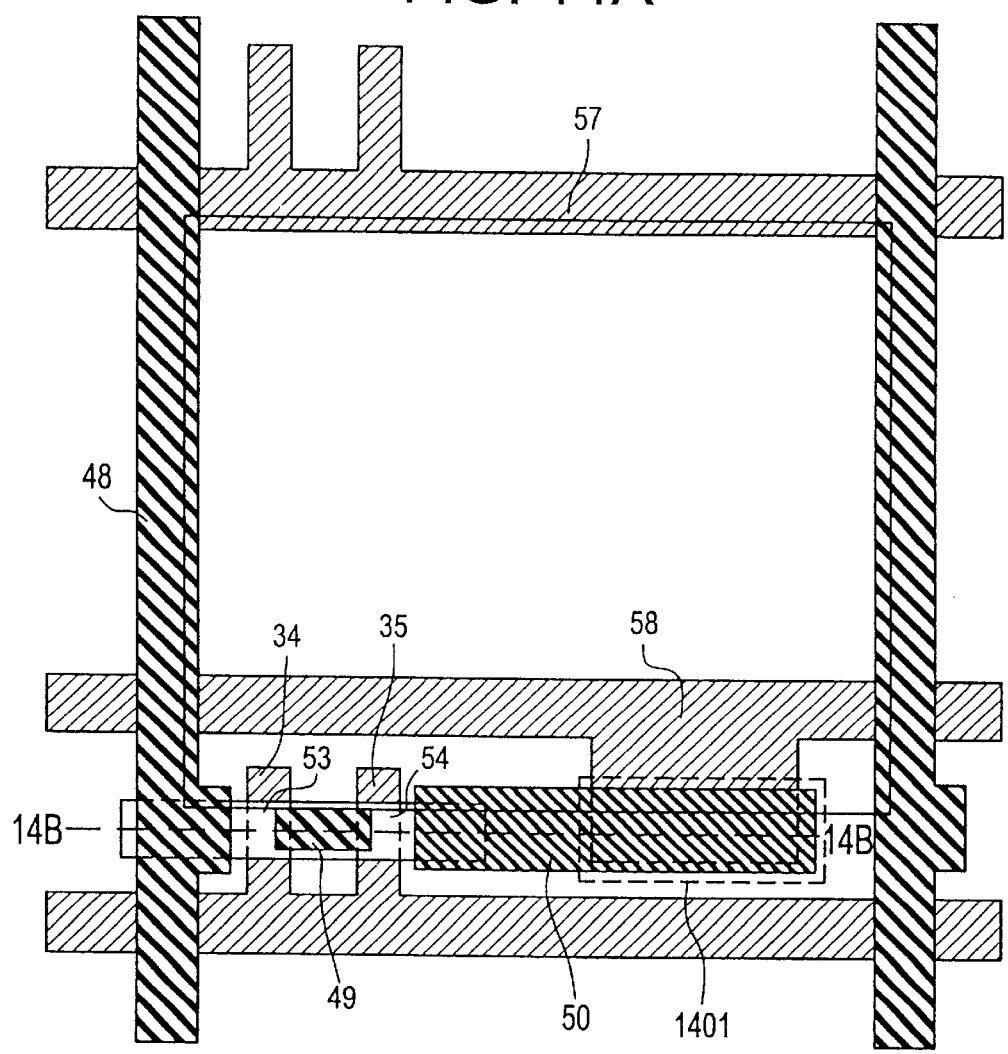
FIG. 14A and FIG. 14B show the constitution of a pixel matrix circuit in Embodiment 10.

FIG. 14A shows a top view of a part of the pixel matrix circuit of this Embodiment, in which the reference numerals have the same meanings as above. The part of this drawing not referred to hereinabove is described below.

Figure 14B:
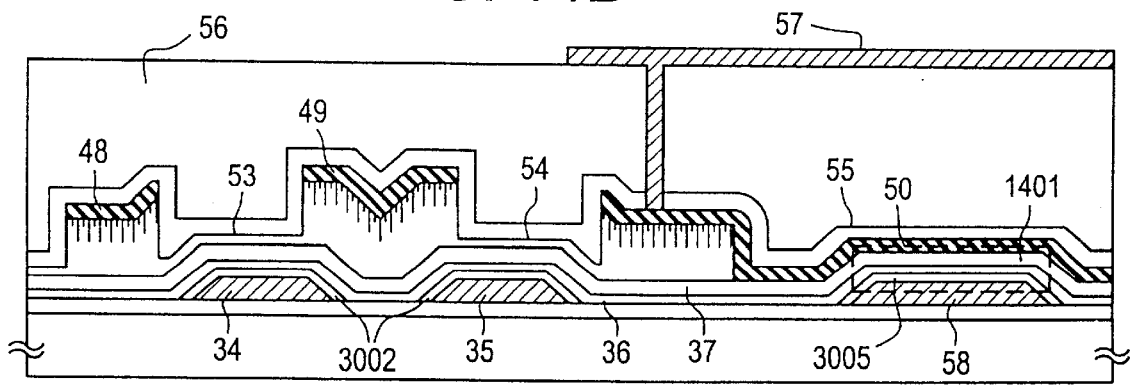

A cross-sectional view of FIG. 14A as cut along the line A–A' is shown in FIG. 14B. Though not shown in FIG. 13C, a capacity wiring 58 of an aluminum film, which is the same as that for the gate wiring, is formed in parallel to the gate wiring, as in FIG. 14B. The surface of the capacity wiring 58 is subjected to anodic oxidation to have an oxide film 3005 thereon.

The capacity wiring 58 provides a subsidiary capacitance (Cs) in the region 1401 that overlaps with the drain electrode 50 (the region 1401 is surrounded by the dotted line in the drawing). In this case, the gate-insulating layers 3005, 36 and 37 are the dielectrics for the subsidiary capacitance. The constitution of the subsidiary capacitance is not limited to only the embodiment illustrated in this Embodiment.

Embodiment 11

Embodiment 10 is to demonstrate an embodiment of using a semiconductor film as crystallized through laser irradiation to form a driver circuit (peripheries-driving circuit) and a pixel matrix circuit as integrated on one substrate. Being different from that, this Embodiment is to demonstrate an embodiment of crystallizing a semiconductor film through RTA.

FIG. 15A to FIG. 15D show a process of the embodiment of this Embodiment. In those drawings, the numeral references have the same meanings as those in FIG. 12A to FIG. 12D. An amorphous silicon film having a thickness of from 100 to 600 nm is formed on a silicon oxynitride film 37. In this Embodiment, the thickness of the amorphous silicon film is 200 nm. Next, the amorphous silicon film is crystallized through RTA for solid phase crystal growth, as in Embodiment 9, to convert it into a crystalline silicon film 3004.

In the crystallization step of this Embodiment, used is a halogen lamp (peak wavelength: 1.15_m, wavelength range: 0.4 to 4_m). The light from the lamp is linearly focused to give a linear beam having a width of 10 mm, and scanned over the substrate. Depending on the scanning rate, the exposure time was controlled to fall between 10 and 60 seconds but typically between 15 and 30 seconds. By controlling the output of the halogen lamp, the amorphous silicon film is heated at 700 to 1000_C. In this Embodiment, the scanning rate is 0.5 mm/sec (this corresponds to an exposure time of 20 seconds), the output of the halogen lamp is 7.7 W, and the amorphous silicon film is thus heated at about 920_C to be crystallized into the crystalline silicon film 3004.

After the crystallization through RTA, the crystalline silicon film 3004 is annealed by exposing it to laser beams of excimer laser, YAG laser or the like or to intense light equivalent to such laser beams. The annealing is to additionally crystallize the amorphous component still remaining in the crystalline silicon film 3004 to thereby enhance the crystallinity of the film 3004.

Solid phase crystallization in an electric furnace takes tens hours, but RTA crystallization takes only tens seconds. Therefore, the latter is advantageous in that the throughput of the devices produced is high and that the thermal damage to glass substrates is small.

After the RTA crystallization, the crystalline silicon film 3004 is processed in the same manner as in Embodiment 10. Briefly, as in FIG. 15B, phosphorus is added to the film 3004 to form an $n^+$ layer 38, an $n^-$ layer 39, and an i-layer 40. Next, boron is added thereto to form a $p^{++}$ layer 41 and a $p^-$ layer 42, as in FIG. 15C.

Figure 15A:
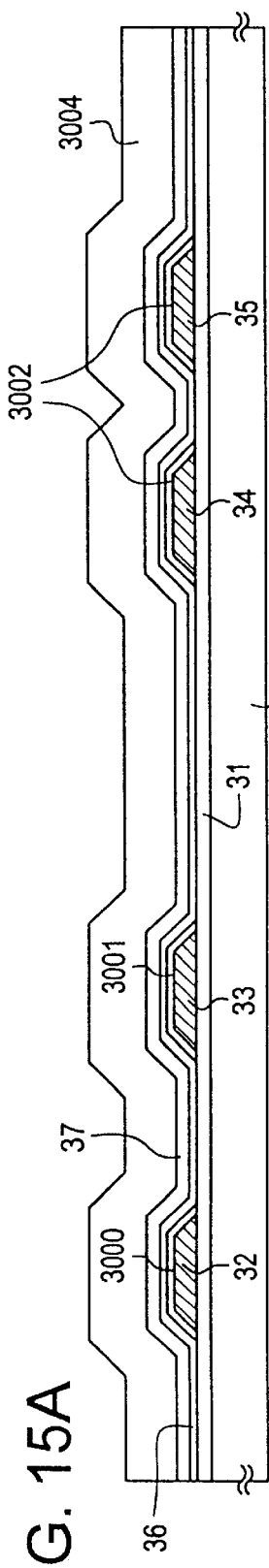
FIG. 15A to FIG. 15D show a process for producing a semiconductor circuit in Embodiment 11.
Figure 15B:
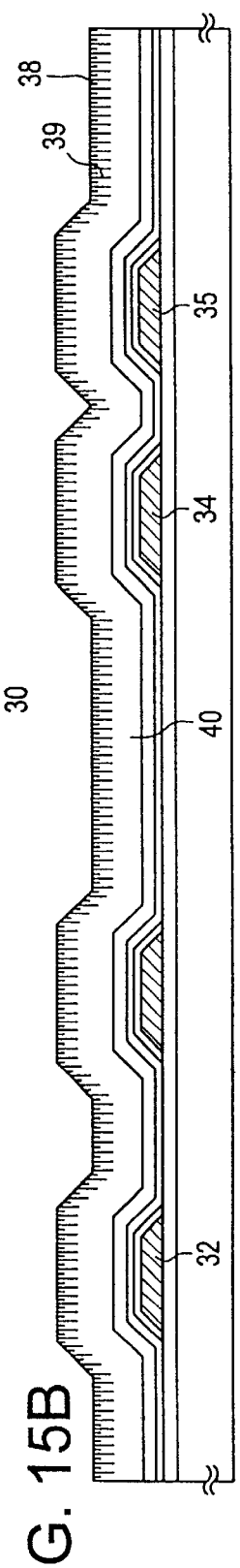
Figure 15C:
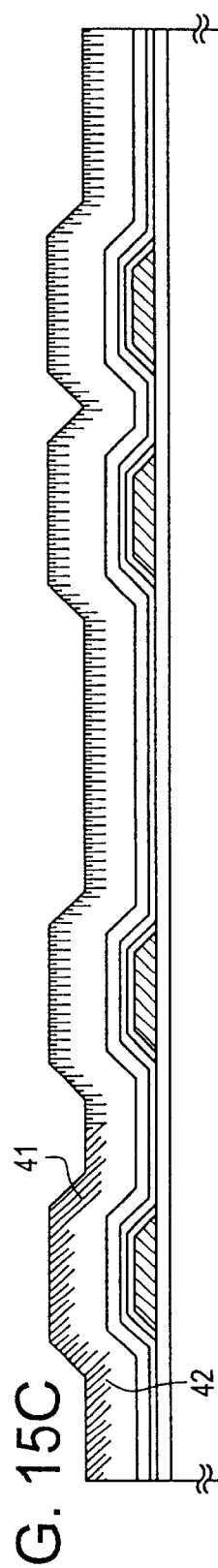
Figure 15D:
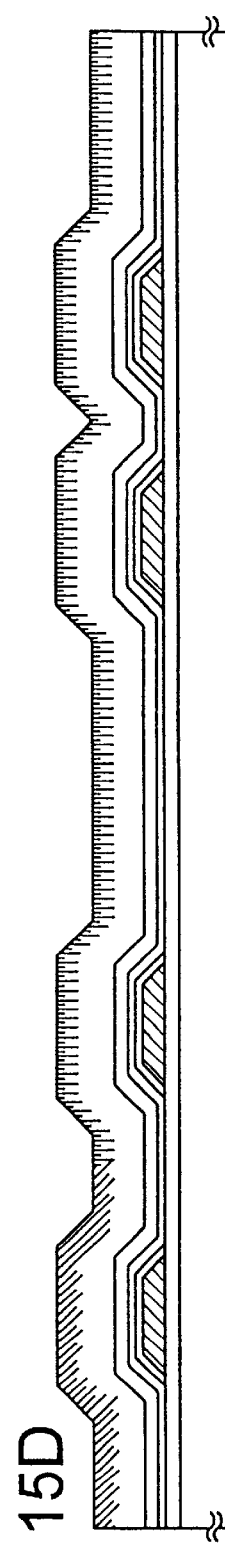

Next, this is annealed with laser beams, as in FIG. 15D, by which the crystallinity of the crystalline silicon film 3004 having become partly amorphous due to the addition of phosphorus and boron thereto is improved. The laser annealing activates the impurities (phosphorus and boron) in the film 3004. Prior to this laser annealing, the film 3004 may be dehydrogenated through RTA to thereby prevent hydrogen bumping in the laser annealing step.

Next, the structure of FIG. 15D is processed according to the process of Embodiment 10 illustrated in FIG. 13A to FIG. 13C and FIG. 14A and FIG. 14B, whereby is formed an active-matrix-type display device having a driver circuit and a pixel matrix circuit as integrated on the substrate.

Embodiment 12

This Embodiment is to demonstrate still another embodiment of producing an active-matrix-type display device, which is different from the embodiments of Embodiments 10 and 11.

The process of this Embodiment is characterized in that the fusion crystallization with laser beams or the solid phase crystallization through RTA is not followed by laser annealing for improving the crystallinity of the crystalline film formed. In other words, in this Embodiment, the crystalline film formed is directly subjected to the next step of adding phosphorus to the film. In this, the phosphorus addition may be performed in the same manner as in Embodiment 10.

Figure 16:
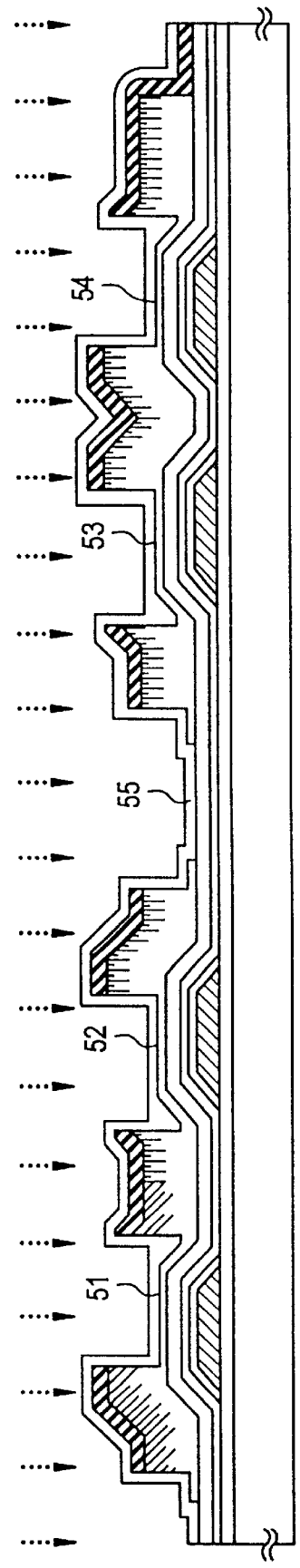
FIG. 16 show sa process for producing a semiconductor circuit in Embodiment 12.

Specifically, the process of this Embodiment is characterized in that the crystallinity of the channel-forming region is improved (in this step, the impurities added are activated, and the film is recrystallized) after a protective film 55 is formed as in FIG. 16. In this process, the channel-forming regions 51 to 54 are self-alignedly exposed to laser beams via the protective film 55 of a silicon oxynitride film.

The laser annealing of the structure of FIG. 16 is advantageous in that it prevents out-diffusion of impurities of phosphorus and boron from the source/drain regions and that the power of the laser beams (laser energy) necessary for it may be reduced to a half or so.

This Embodiment is not limited to only the structure illustrated in the drawings. Producers may select the optimum structure in combination with any of the TFT structures of Embodiments 1 to 4, while taking the advantages of those structures of Embodiments 1 to 4 into consideration, for designing the intended circuits. This Embodiment may be combined with any structures of all other Embodiments.

Embodiment 13

This Embodiment is to demonstrate still another embodiment of producing an active-matrix-type display device, in which the laser annealing step just after the crystallization step in the processes of Embodiments 10 and 11 is omitted, like in Embodiment 12. In this Embodiment, the crystallization step is followed by ion doping for adding phosphorus to the crystalline silicon film to form the $n^+$ layer 38 and the $n^-$ layer 39 (see FIG. 12B, FIG. 15B). Next, boron is added thereto also through ion doping to form the $p^{++}$ layer 41 and the $p^-$ layer 42 for PTFT in the semiconductor layer (see FIG. 12C, FIG. 15C).

Figure 17A:
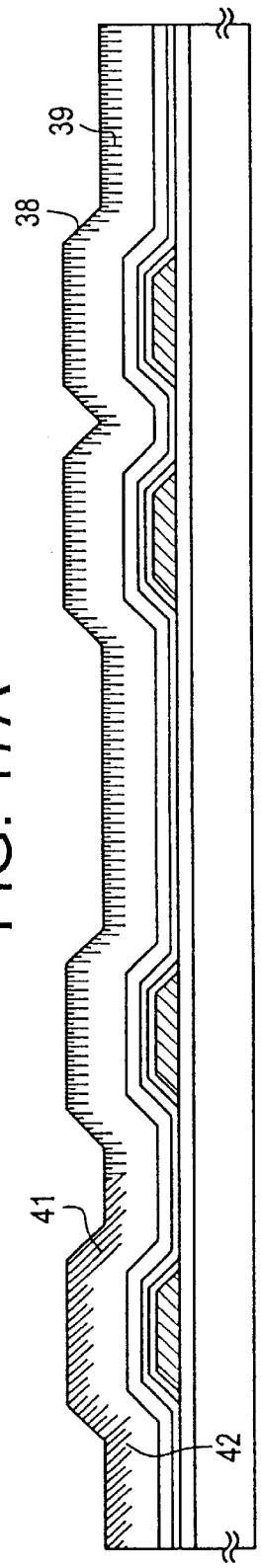
FIG. 17A and FIG. 17B show a process for producing a semiconductor circuit in Embodiment 13.
Figure 17B:
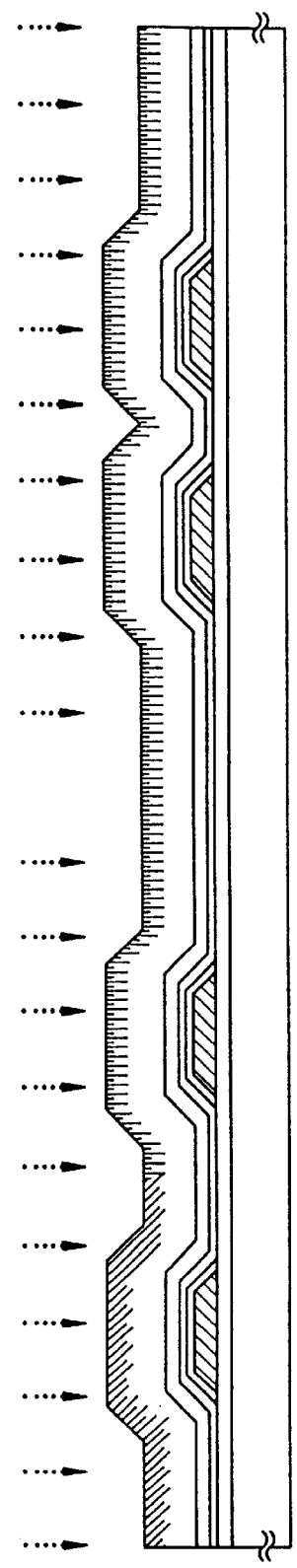

The structure thus produced is subjected to RTA. In this Embodiment, this RTA treatment is to active the impurities added (phosphorus and boron) and to dehydrogenate the semiconductor layer (since hydrogen ions are implanted into the layer along with phosphorus and boron ions in the ion doping not followed by mass separation). (FIG. 17A)

Next, this is annealed with laser beams. In this step, the semiconductor layer having become amorphous in the previous steps of adding the impurities is recrystallized to improve the crystallinity of the layer. If desired, this laser annealing step may be performed after the semiconductor layer is etched to give an island semiconductor layer.

After this, the structure is processed in the same manner as in Embodiment 10. This Embodiment is not limited to only the structure illustrated in the drawings. Producers may select the optimum structure in combination with any of the TFT structures of Embodiments 1 to 4, while taking the advantages of those structures of Embodiments 1 to 4 into consideration, for designing the intended circuits. This Embodiment may be combined with any structures of all other Embodiments.

Embodiment 14

Figure 18A:
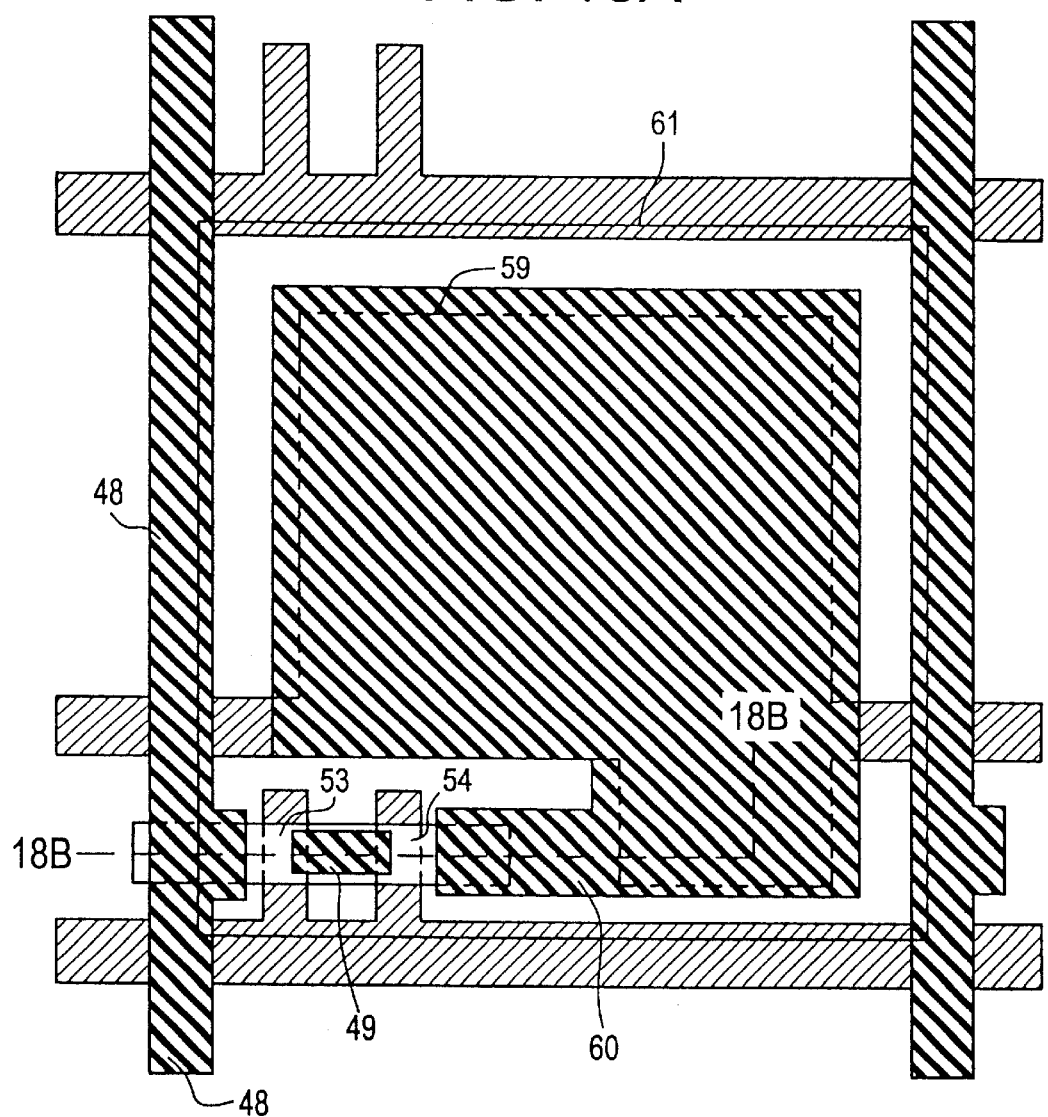
FIG. 18A and FIG. 18B show the constitution of a pixel matrix circuit in Embodiment 14.

This Embodiment is to demonstrate the production of a reflection-type liquid crystal display device, based on the process of Embodiment 10. FIG. 18A shows a top view of one pixel of a pixel matrix circuit of a reflection-type liquid crystal display device.

Figure 18B:
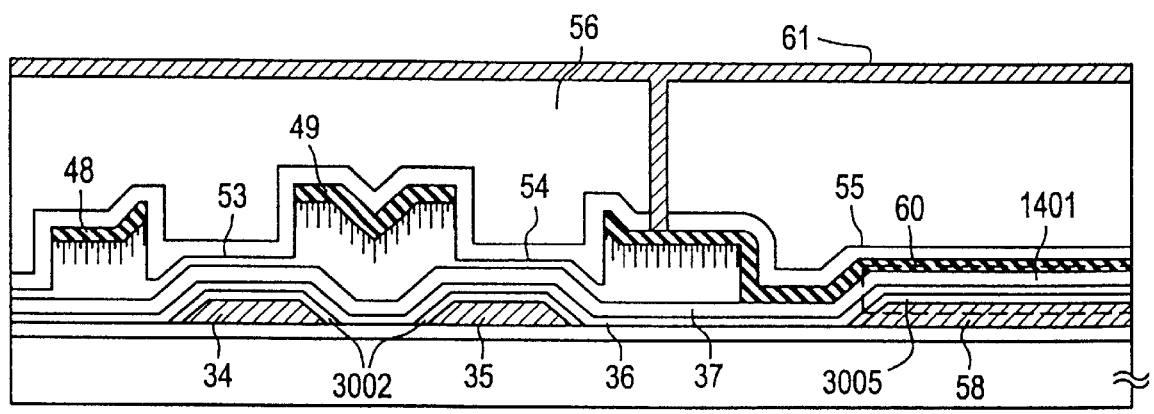

In FIG. 18A, the parts corresponds to those in Embodiment 10 are designated by the same numerals as in Embodiment 10, and the detailed description of the parts is omitted herein. FIG. 18B is a cross-sectional view of FIG. 18A as cut along the line B–B'.

The difference between Embodiment 14 and Embodiment 10 is that the capacity wiring 59 covers the entire area of the pixel in the former. Being different from the transmittance-type device of Embodiment 10, the reflection-type device of this Embodiment 14 is not required to have a large aperture. Therefore, in this, the back surface of the pixel electrode 61 could be everywhere in service.

In this Embodiment, the drain electrode 60 is so positioned that it covers the entire area of the pixel and overlaps with the capacity wiring 59 in a largest possible range. In that manner, almost all area of the pixel can be utilized as the subsidiary capacitance, whereby the device may have a large capacity. The dielectrics for the subsidiary capacitance are the oxide film 3005 formed through anodic oxidation, the silicon nitride film 36 and the silicon oxynitride film 37.

The pixel electrode 61 is a reflective electrode, and it is desirable that the electrode is made from aluminum having high reflectivity or from a material comprising mainly aluminum. Where the liquid crystal display device of this Embodiment is used in projection-type displays, it is desirable that the pixel electrode has a flat and smooth surface. On the other hand, where it is used in direct viewing displays, the surface of the pixel electrode must be roughened to make it have an increased irregular reflectivity and have a broadened angle of visibility.

This Embodiment is not limited to only the structure illustrated in the drawings. Producers may select the optimum structure in combination with any of the TFT structures of Embodiments 1 to 4, while taking the advantages of those structures of Embodiments 1 to 4 into consideration, for designing the intended circuits. This Embodiment may be combined with any structures of all other Embodiments.

Embodiment 15

This Embodiment is to demonstrate a modification of the liquid crystal display device of Embodiment 10. Herein formed are BM (black matrices) in the device.

According to the process of Embodiment 10, a layered structure having an interlayer insulating film 56 is formed. In this Embodiment, the interlayer insulating film 56 is made of a photosensitive acrylic resin. The interlayer insulating film 56 is patterned, and half-etched to form depressions 65 and 66. (FIG. 19A)

The entire surface of the structure of FIG. 19A is coated with a black resin film (not shown). The black resin film is an organic resin film containing graphite, carbon, dye or the like. The organic resin film may be a film of polyimide, acrylic resin or the like. In this Embodiment, used is a photosensitive acrylic resin containing graphite as dispersed therein.

After thus coated with the black resin film, the region of the depressions 65 and 66 only is selectively exposed, whereby the black resin film remains only in that region. Next, this may be ashed in an oxygen plasma atmosphere to thereby increase the surface smoothness of the black resin films remained.

In that manner, formed are black matrices 67 and 68 of the black resin. Next is formed a pixel electrode 69 of an ITO film. In this Embodiment, the pixel electrode 69 is so patterned that the edge of the pixel electrode 69 overlaps with the edge of the black matrix 68 (that is, the edge of the pixel electrode 69 is inside the BM, black matrix 68, as so indicated by 70).

As in the above, completed is an active matrix substrate having the structure of FIG. 19B. This is used in ordinary cell construction to produce liquid crystal display devices. The black matrices produced in this Embodiment have the advantage of not producing parasitic capacitance with other wiring parts.

This Embodiment is not limited to only the structure illustrated in the drawings. Producers may select the optimum structure in combination with any of the TFT structures of Embodiments 1 to 4, while taking the advantages of those structures of Embodiments 1 to 4 into consideration, for designing the intended circuits. This Embodiment may be combined with any structures of all other Embodiments.

Embodiment 16

Figure 20:
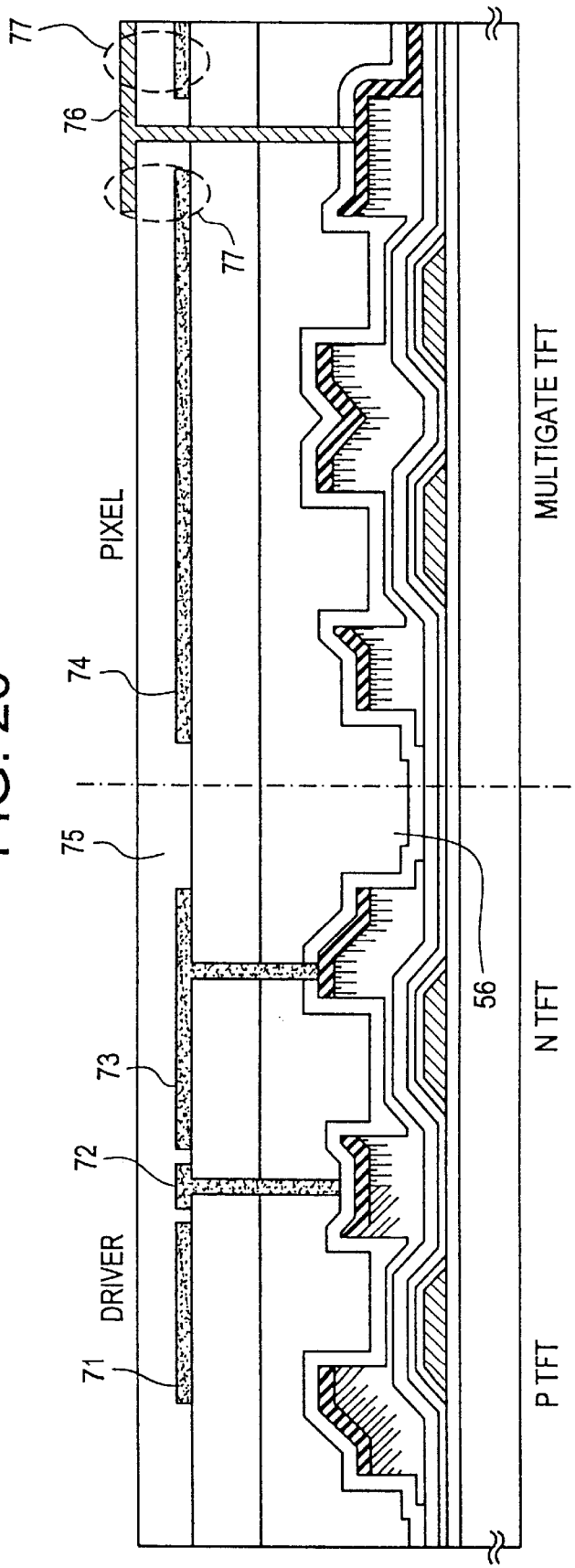
FIG. 20 shows the constitution of a pixel TFT in Embodiment 16.
Figure 21:
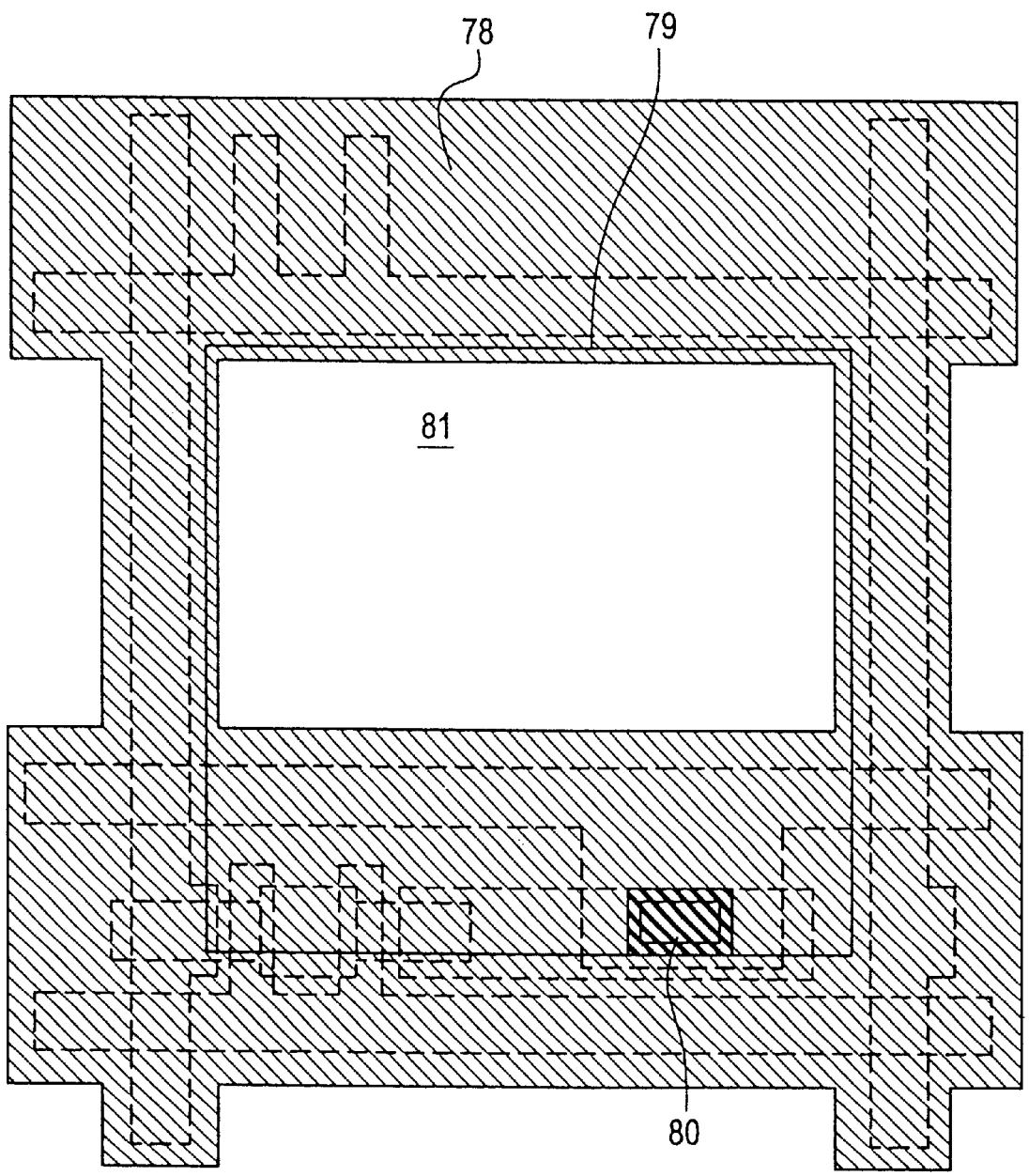
FIG. 21 shows the constitution of a pixel matrix circuit in Embodiment 16.

This is to demonstrate a modification of Embodiment 15, with reference to FIG. 20 and FIG. 21. The black matrices formed herein are different from those in Embodiment 15. Concretely, a conductive film is used to form the black matrices herein.

In FIG. 20, 56 is an interlayer insulating film of an organic resin film, and 71 to 74 are black matrices or wiring patterns acting also as black matrices, which are made of a conductive film. The conductive film may be any of titanium film, chromium film, titanium/aluminum laminate film or the like.

As being conductive, the black matrices in this Embodiment have various additional functions. The pattern 71 is a black matrix as fixed to the common voltage (earth voltage). The pattern 72 is connected with the drain electrode of a CMOS circuit, and is used as a lead wire. In that manner, this Embodiment easily realizes a multi-layered wiring structure.

The pattern 73 is connected with the source electrode of the CMOS circuit, and functions as a connection wire and also as a black matrix. The pattern 74 is a black matrix as positioned in the pixel matrix circuit and this is basically provided over the other wiring patterns and TFT.

Over the black matrices (or wiring patterns also acting as black matrices) 71 to 74, further provided is an interlayer insulating film 75. The interlayer insulating film 75 may be made of a silicon oxide film, a silicon nitride film, a silicon oxynitride film, an organic resin film or a laminate of those films. The interlayer insulating film 75 functions later as the dielectric for subsidiary capacitance.

Through the interlayer insulating film 75, formed is a contact hole, in which is formed a pixel electrode 76 of ITO. In the pixel matrix circuit, the black matrix 74 and the pixel electrode 76 produce subsidiary capacitance 77.

FIG. 21 shows one embodiment of the positioning of black matrices in the pixel matrix circuit. In the embodiment of FIG. 21, a black matrix 78 is positioned to overlap with the structure of FIG. 14A. In FIG. 21, the thick line 79 is a pixel electrode, and 80 is a contact part at which the pixel electrode 79 is contacted with the underlying drain electrode.

The black matrix 78 basically covers the other wiring patterns and TFT, while having opening windows only in the image-displaying region 81 and the contact part 80. For transmission-type liquid crystal display devices such as that illustrated in this Embodiment, the most important matter is to reduce the area that is occupied by the black matrices to thereby broaden the area of the image-displaying region 81 (that is, to increase the aperture of the device).

This Embodiment is not limited to only the structure illustrated in the drawings. Producers may select the optimum structure in combination with any of the TFT structures of Embodiments 1 to 4, while taking the advantages of those structures of Embodiments 1 to 4 into consideration, for designing the intended circuits. This Embodiment may be combined with any structures of all other Embodiments.

Embodiment 17

This is to demonstrate still another embodiment of producing an active matrix substrate, in which the TFT structure differs from that illustrated in Embodiment 10. Herein referred to is FIG. 22.

Figure 22:
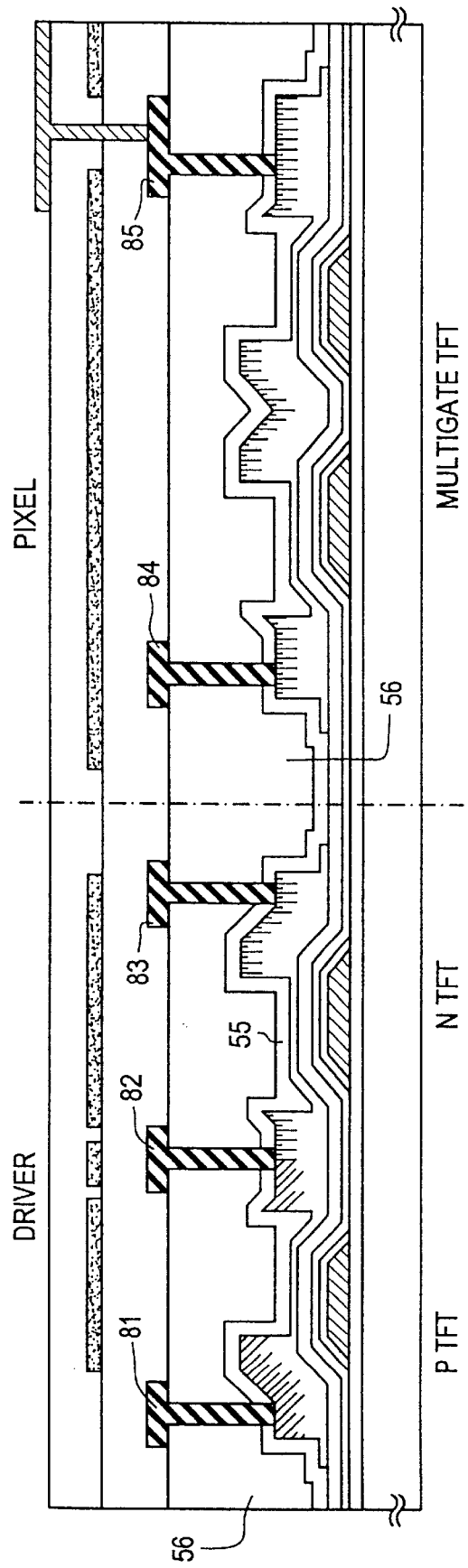
FIG. 22 shows the constitution of a pixel TFT in Embodiment 17.

The most important point in the structure of FIG. 22 is that the uppermost part of each semiconductor layer (in source/drain regions) is a first conductive layer ($n^+$ region or $p^{++}$ region), and that each conductive layer is covered with a protective film 55 and an interlayer insulating film 56, and is electrically connected with lead electrodes 81 to 85.

To produce the illustrated structure, channel etching to give the channel-forming regions is performed via resist masks. After the channel etching in that manner, the protective film 55 and the interlayer insulating film 56 are formed over the conductive layers, and thereafter the lead electrodes 81 to 85 are formed.

In the structure of this Embodiment, the lead electrodes (these function as source/drain electrodes or as rounding wires) 81 to 85 are spaced from the gate electrode by the interlayer insulating film 56. Accordingly, in this structure, the parasitic capacitance between the source/drain electrodes and the gate electrode can be much more reduced. More effectively, the interlayer insulating film 56 is made from an organic resin material having a small dielectric constant.

The structure of this Embodiment is applicable to TFT of Embodiments 1 to 4. Needless-to-say, it can be combined with any structures of all other Embodiments. This Embodiment is not limited to only the structure illustrated in the drawings. Producers may select the optimum structure in combination with any of the TFT structures of Embodiments 1 to 4, while taking the advantages of those structures of Embodiments 1 to 4 into consideration, for designing the intended circuits.

Embodiment 18

Figure 23:
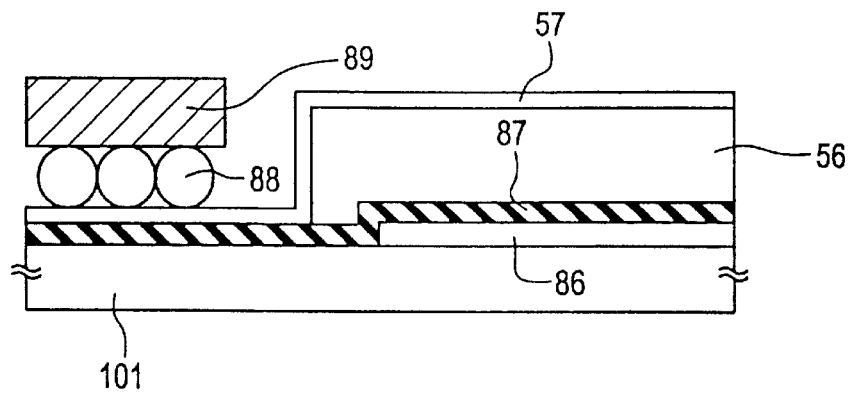
FIG. 23 shows the constitution of an external terminal connecting site in Embodiment 18.

This is to demonstrate one embodiment of connecting the active matrix substrate of any of Embodiments 10 to 18 with external terminals, with reference to FIG. 23. FIG. 23 is an enlarged view of a connecting site at which the active matrix substrate is connected with an external terminal (typically, flexible print circuit, FPC). The connecting site is referred to as an FPC connecting site, and this is positioned at the edge of the active matrix substrate.

In FIG. 23, 101 is a glass substrate, and 86 is an insulating layer. The insulating layer 86 has a laminate structure comprising the undercoating film 102, the silicon nitride film 104 and the silicon oxynitride film 105 all shown in FIG. 1(A). A second wiring layer 87 is formed over the substrate 101 and the layer 86. The second wiring layer 87 is a connecting wire layer via which the information from the external terminal is transmitted to the source/drain electrodes, the gate electrode, etc.

This Embodiment is characterized in that the second wiring layer 87 is in direct contact with the glass substrate 101. To realize this structure, the insulating layer 86 below the FPC connecting site must be completely removed in the third patterning step in the process of Embodiment 1. In this structure, the second wiring layer 87 is directly formed on the hard glass substrate. Therefore, in this, FPC is firmly fixed to the second wiring layer 87 in the FPC connecting site.

In the FPC connecting site, the interlayer insulating film 56 is partially removed in the subsequent step, whereby the overlying ITO film 57 is directly contacted with the second wiring layer 87. In this structure, the ITO film 57 is so laminated over the second wiring layer 87 that it is directly contacted with at least the second wiring layer 87 in the FPO connecting site. As the case may be, an independent pattern of an electrode pad of the ITO film 57 may be formed only in the FPC connecting site.

The ITO film 57 functions as a buffer layer for anisotropic conductive films 88 to be formed in the subsequent step. The anisotropic conductive films 88 contain conductive particles (of gold-coated silica glass or the like), and the conductive particles are pushed into the ITO film to improve the ohmic contact between the FPC terminal 89 and the ITO film 57.

At the FPC connecting site having the constitution shown in FIG. 23, the FPC terminal 89 is pressed against the active matrix substrate via the anisotropic conductive films 88 formed therebetween. In that manner, the external terminal, FPC is connected with the active matrix substrate, as in FIG. 23. The connecting mode illustrated herein may be applied to the active matrix substrate of any of Embodiments 10 to 20 to attain good electrical connection of the substrate to external terminals.

Embodiment 19

This is to demonstrate one embodiment for improving the patterning efficiency in forming TFT of the invention on large-area glass substrates.

Where fine semiconductor circuits are formed on large-area glass substrates, there occurs a problem of patterning error doe to warping or shrinkage of glass substrates. To solve this problem, specifically noted is an exposing method where is used an exposing device of a so-called stepper. In stepper exposure, only a part of one reticule 90 can be selectively exposed.

In this Embodiment, the necessary circuit patterns for the driver circuit and the pixel matrix circuit are formed in different portions of one reticule. In this case, the region for the repetition of one and the same structure is formed through repetitive exposure for one and the same circuit pattern.

Figure 24:
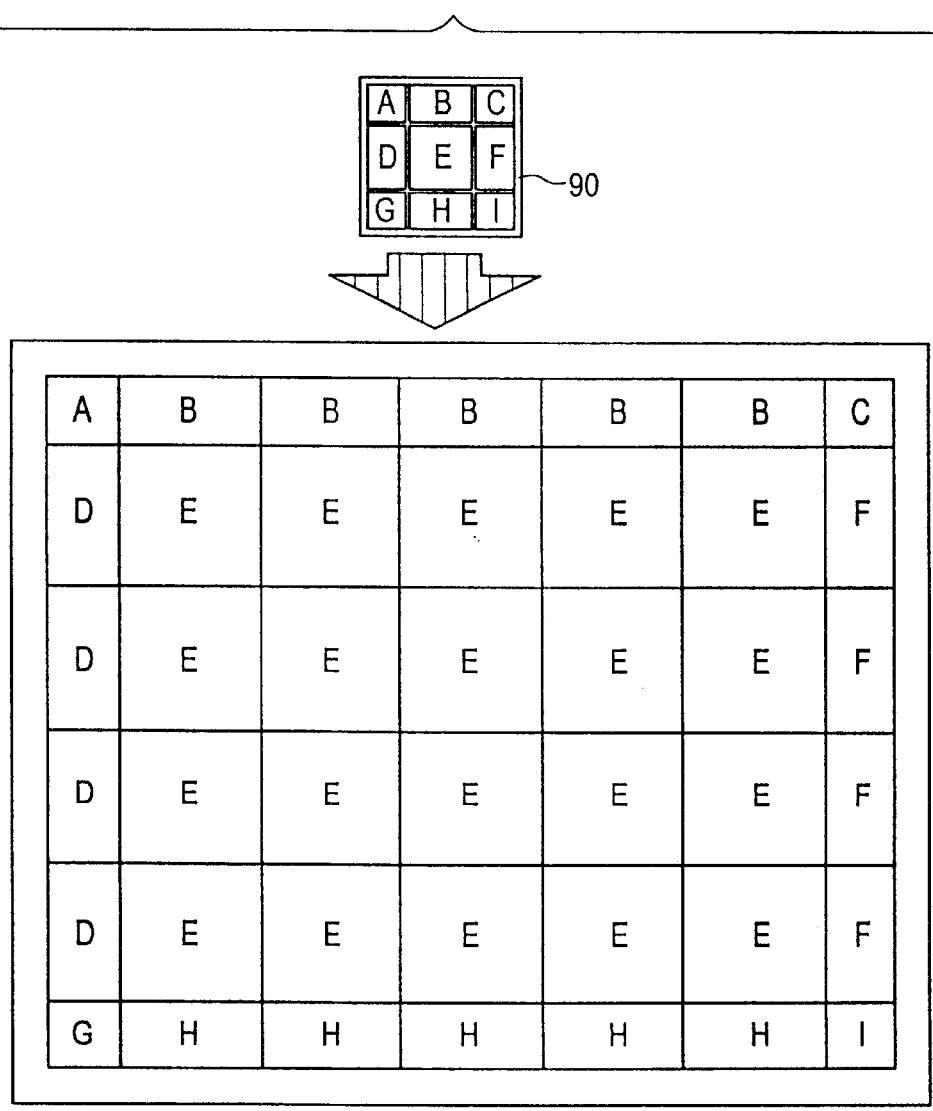
FIG. 24 shows a means of exposing a semiconductor circuit in Embodiment 19.

FIG. 24 is referred to, in which patterns A, C, G and I are circuit patterns for forming the edges of the driver circuit; patterns B and H are repetitive circuit patterns for the driver circuit to be scanned horizontally; patterns D and F are repetitive circuit patterns for the driver circuit to be scanned vertically; and a pattern E is a repetitive circuit pattern for the pixel matrix circuit.

In that manner, for the driver circuit and the pixel matrix circuit that are comprising repetitive circuits having the same structure unit, only their edges are formed of their own independent circuit patterns while their inside areas are formed of one and the same circuit pattern unit to be repeated, and these are combined to give the complete patterns.

In this system, the same circuit pattern units may be used in forming the complete patterns. Therefore, in this, the number of the circuit pattern units to be written in one reticule may be reduced, and the size of the reticule to be used may be reduced. In addition, in this, since one reticule can be repeatedly used many times for large-area substrates, the time for mask changing is reduced and the throughput of the device formed is increased.

For example, for a pixel matrix circuit of SXGA, 1280 pixels are aligned in rows and 1024 pixels in columns. For this, the pattern circuits corresponding to 256 pixels may be written in rows for the pattern E, and five repetitive exposures may be done for those rows; while the pattern circuits corresponding to 256 pixels may be written in columns, and four repetitive exposures may be done for those columns.

In this system where the number of repetitive exposures in rows and in columns are represented by n and m, respectively, while the number of pixels in rows and in columns are by X and Y, respectively, X/n pixel patterns in rows and Y/m patterns in columns must be written for the circuit patterns to form the pixel matrix circuit. According to this regularity, high-precision displays with 1920×1080 pixels, such as ATV (advanced TV), can be easily realized.

Embodiment 20

This is to demonstrate one embodiment of AMLCD (active-matrix-type liquid crystal display) comprising the active matrix substrate of any of Embodiments 10 to 17. The AMLCD of this Embodiment comprises inverse stagger-type TFT for the driving circuit and the pixel matrix circuit as formed on one and the same substrate. In this, the basic structure of the driving circuits is designed on the basis of a CMOS circuit. Therefore, the power for the AMLCD of this Embodiment is low.

Figure 25A:
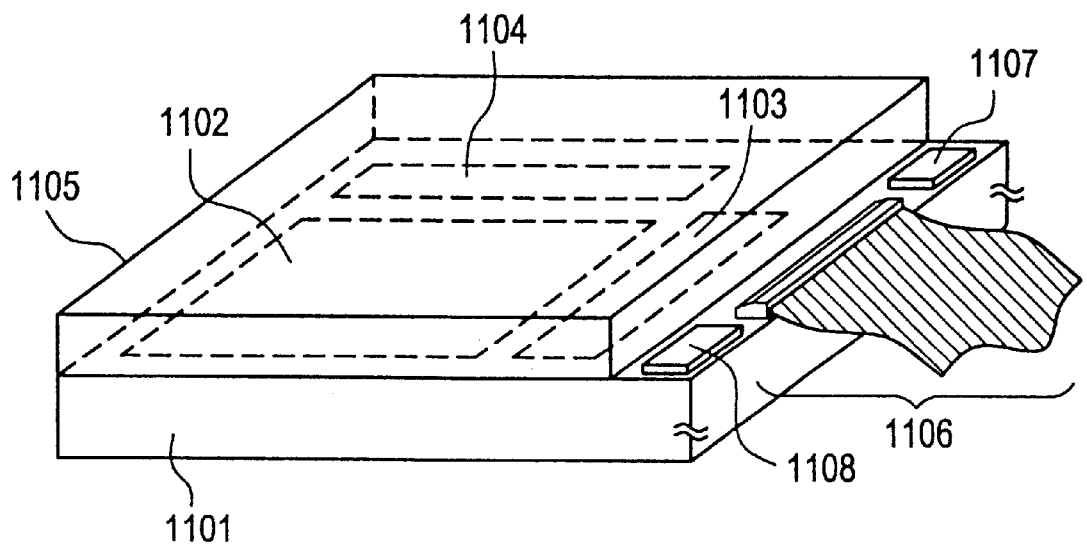
FIG. 25A and FIG. 25B each show the constitution of an electro-optical device in Embodiment 20.
Figure 25B:
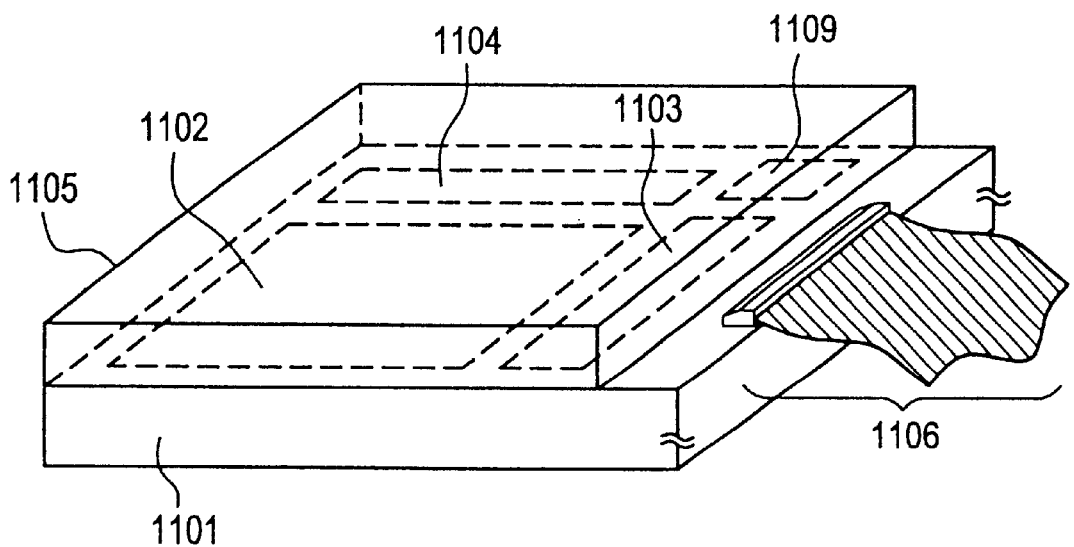

FIG. 25A and FIG. 25B show the outward appearance of the AMLCD of this Embodiment. In FIG. 25A, 1101 is an active matrix substrate, on which is mounted a TFT of the invention that comprises a pixel matrix circuit 1102, a source driving circuit 1103 and a gate driving circuit 1104. In this, 1105 is a counter substrate.

The active matrix substrate 1101 and the counter substrate 1105 are stuck together with their one end being aligned. At the other end, the counter substrate 1105 is partly cut, and FPC (flexible print circuit) 1106 is connected with the exposed area of the active matrix substrate. Via the FPC 1106, external information is transmitted into the inside of the circuit.

On the exposed area of the active matrix substrate connected with the FPC 1106, mounted are IC chips 1107 and 1108. These IC chips comprise various circuits, such as video information-processing circuit, timing pulse-generating circuit, correcting circuit, memory circuit, arithmetic circuit, etc., as formed on silicon substrates. In FIG. 25C, two IC chips are mounted on the active matrix substrate. However, one IC chips or three or more IC chips may be mounted thereon.

FIG. 25B is another modification of AMLCD of this Embodiment. In FIG. 25A and FIG. 25B, the same parts are represented by the same numeral references. The embodiment of FIG. 25A differs from that of FIG. 25A in that the signal information as processed by the IC chips in FIG. 25A is processed by the logic circuit 1109 of TFT formed on the substrate in the embodiment of FIG. 25B.

In the embodiment of FIG. 25B, the basic structure of the logic circuit 1109 may be designed on the basis of a CMOS circuit, like that in the driving circuits 1103 and 1104, for which is used the inverse stagger-type TFT of the invention.

TFT of the invention are usable not only as switching elements for AMLCD but also as those for EL (electroluminescent) display devices. In addition, bottom-gate-type TFT of the invention are usable in circuits for image sensors, etc.

As in the above, TFT of the invention are applicable to various electro-optical devices. The terminology "electro-optical device" as referred to herein includes any and every device for converting electric information into optical information and vice versa.

In the AMLCD of this Embodiment, the black matrices may be formed on the counter substrate, or on the active matrix substrate (BM on TFT).

Color filters may be used for color imaging through the device of this Embodiment. Without using color filters, the liquid crystal molecules in the device of this Embodiment may be driven in ECB (electric field control birefringence) mode, GH (guest-host) mode or the like.

Like the technique disclosed in Japanese Patent Application Laid-Open (JP-A) Hei-8-15686, the device of this Embodiment may be combined with a micro-lens array.

Embodiment 21

AMLCD of Embodiment 20 is usable as the display in various electronic instruments. Electronic instruments as referred to herein are directed to those comprising electro-optical devices such as typically AMLCD.

The electronic instruments include video cameras, still cameras, projectors, projection TV, head-mount displays, car navigations, personal computers (including notebook-type ones), portable information terminals (mobile computers, portable telephones, etc.), etc. Some examples of those electronic instruments are shown in FIG. 26A to FIG. 26F.

Figure 26A:
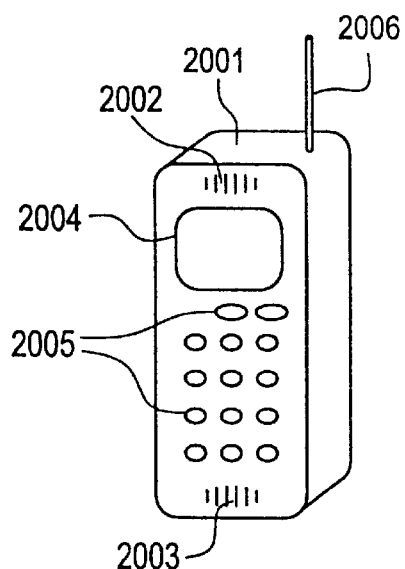
FIG. 26A to FIG. 26F show outlines of various electronic instruments in Embodiment 21.

FIG. 26A is a portable telephone. Its body 2001 is provided with a voice-outputting member 2002, a voice-inputting member 2003, a display device 2004, a control switch 2005, and an antenna 2006. In this, the invention is applicable to the display device 2004, etc.

Figure 26B:
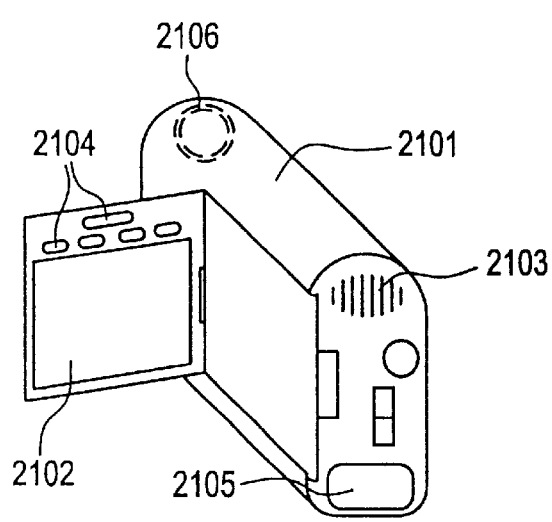

FIG. 26B is a video camera. Its body 2101 is provided with a display device 2102, a voice-inputting member 2103, a control switch 2104, a battery 2105, and an image-receiving member 2106. In this, the invention is applicable to the display device 2102.

Figure 26C:
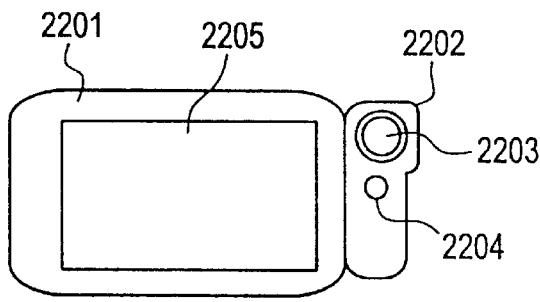

FIG. 26C is a mobile computer. Its body 2201 is provided with a camera member 2202, an image-receiving member 2203, a control switch 2204, and a display device 2205. In this, the invention is applicable to the display device 2205, etc.

Figure 26D:
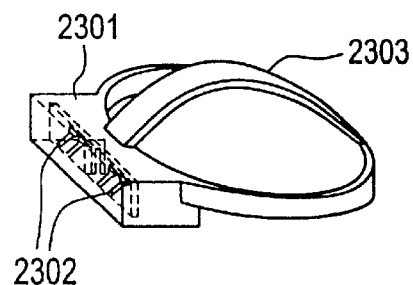

FIG. 26D is a head-mount display. Its body 2301 is provided with a display device 2302, and a band member 2303. In this, the invention is applicable to the display device 2302.

Figure 26E:
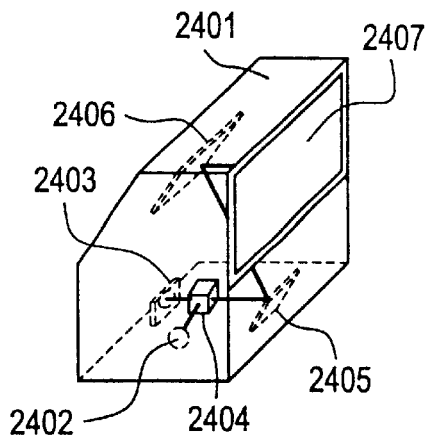
Figure 26F:
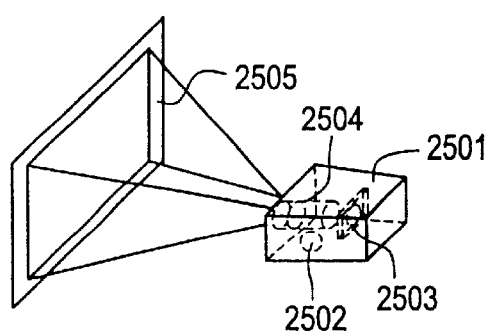

FIG. 26E is a rear projector. Its body 2401 is provided with a light source 2402, a display device 2403, a polarized beam splitter 2404, reflectors 2405 and 2406, and a screen 2407. In this, the invention is applicable to the display device 2403.

FIG. F is a front projector. Its body 2501 is provided with a light source 2502, a display device 2503, an optical system 2504, and a screen 2505. In this, the invention is applicable to the display device 2503.

As in the above, the present invention has extremely broad application ranges, and is applicable to various electronic instruments in various fields. Apart from the examples noted above, the invention is applicable to light bulletin boards, advertising propaganda displays, etc.

Embodiment 22

This is to demonstrate one embodiment of the constitution of a circuit comprising the inverse stagger-type TFT of the invention. Herein referred to are FIG. 27A and FIG. 27B that illustrate the constitution of a shift register circuit. In this Embodiment, employed is the layer structure of Embodiment 10.

Figure 27A:
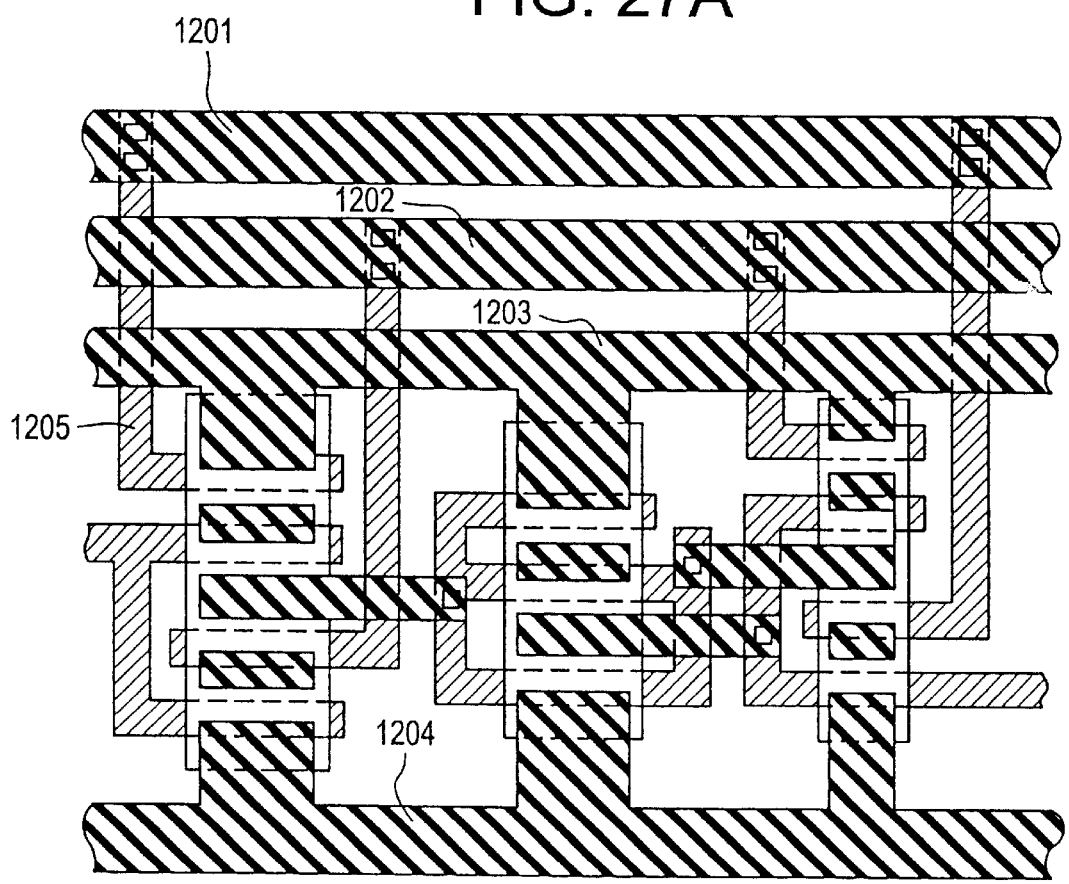
FIG. 27A and FIG. 27B show the pattern constitution of a semiconductor circuit in Embodiment 22.
Figure 27B:
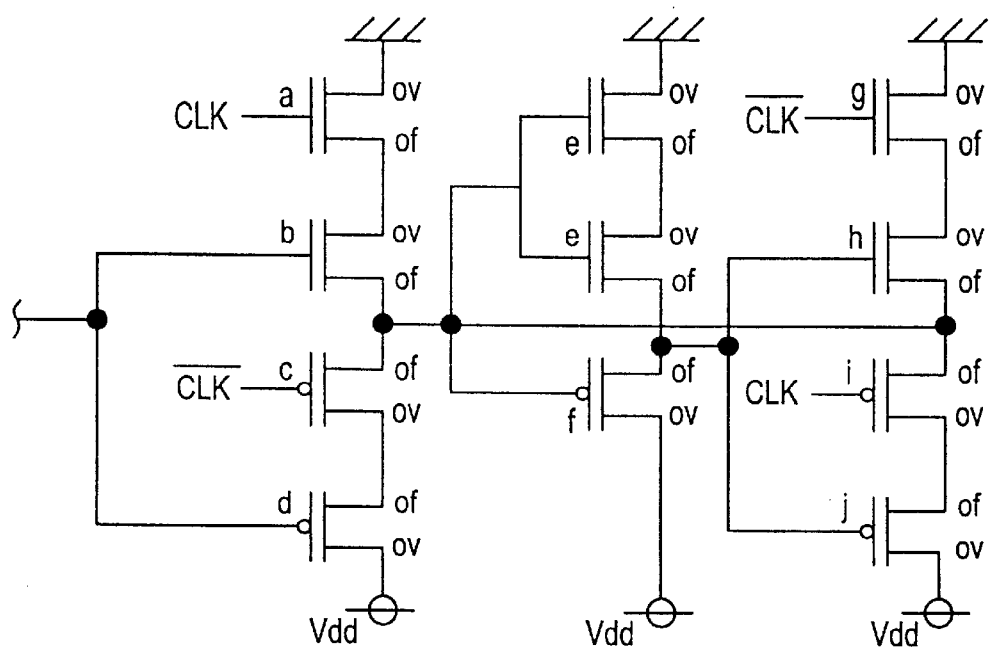

FIG. 27A shows a circuit pattern of one stage of a shift register circuit, and FIG. 27B shows the equivalent circuit pattern of the shift register circuit. In this Embodiment, the positional relationship between FIG. 27A and FIG. 27B nearly corresponds to each other. Therefore, the reference codes in FIG. 27B are referred to in FIG. 27A.

In FIG. 27A, the circuit comprising TFT (a) to TFT (d) and TFT (g) to TFT (j) is a clocked inverter circuit; and the circuit comprising TFT (e) and TFT (f) is an inverter circuit. TFT (e) has a double-gate structure.

In this, 1201 is a CLK line (clock signal line), 1202 is an inverse CLK line (inverse clock signal line), 1203 is a GND wiring line (ground line), and 1204 is a Vdd line (power source line). Those wiring patterns as shadowed with lines rising to the left are all second wiring layers (indicated by 45 to 49 in FIG. 13A).

The wiring 1205 functions as the gate electrode of TFT (a). The wiring patterns as shadowed with lines rising to the right are all first wiring layers (indicated by 32 to 35 in FIG. 12A). The area in which the first wiring layer overlaps with the semiconductor layer is referred to as the gate electrode.

In the constitution of this Embodiment, overlapping regions (ov in FIG. 27B) are provided in the source side of TFT, while mask offset regions (of in FIG. 27B) are in the drain side thereof. Accordingly, in FIG. 27B, the clocked inverter circuit comprising TFT (a) to TFT (d) has a constitution of ov/of/ov/of/of/ov/of/ov in that order from the top.

Specifically, the structure of the part of TFT (a) and TFT (b) is nearly the same as the double-gate structure of the pixel TFT in Embodiment 10, and therefore this part has a repetition of ov/of/ov/of. On the other hand, the part of TFT (b) and TFT (c) has a CMOS structure in which the drain electrode is common to NTFT and PTFT. Therefore, as in Embodiment 5, this part has a repetition of ov/of/of/ov.

The other circuits are basically the same as above. TFT (e) has a double-gate structure, and therefore has a repeated TFT structure of ov/of/ov/of in that order from its side to which it is connected with the GND line 1203.

As having the constitution noted above, the semiconductor circuit of this Embodiment has high voltage resistance and high reliability without sacrificing its operating motion speed. Using the semiconductor circuit of the type of this Embodiment in electro-optical devices improves the reliability of the devices.

Embodiment 23

Figure 28A:
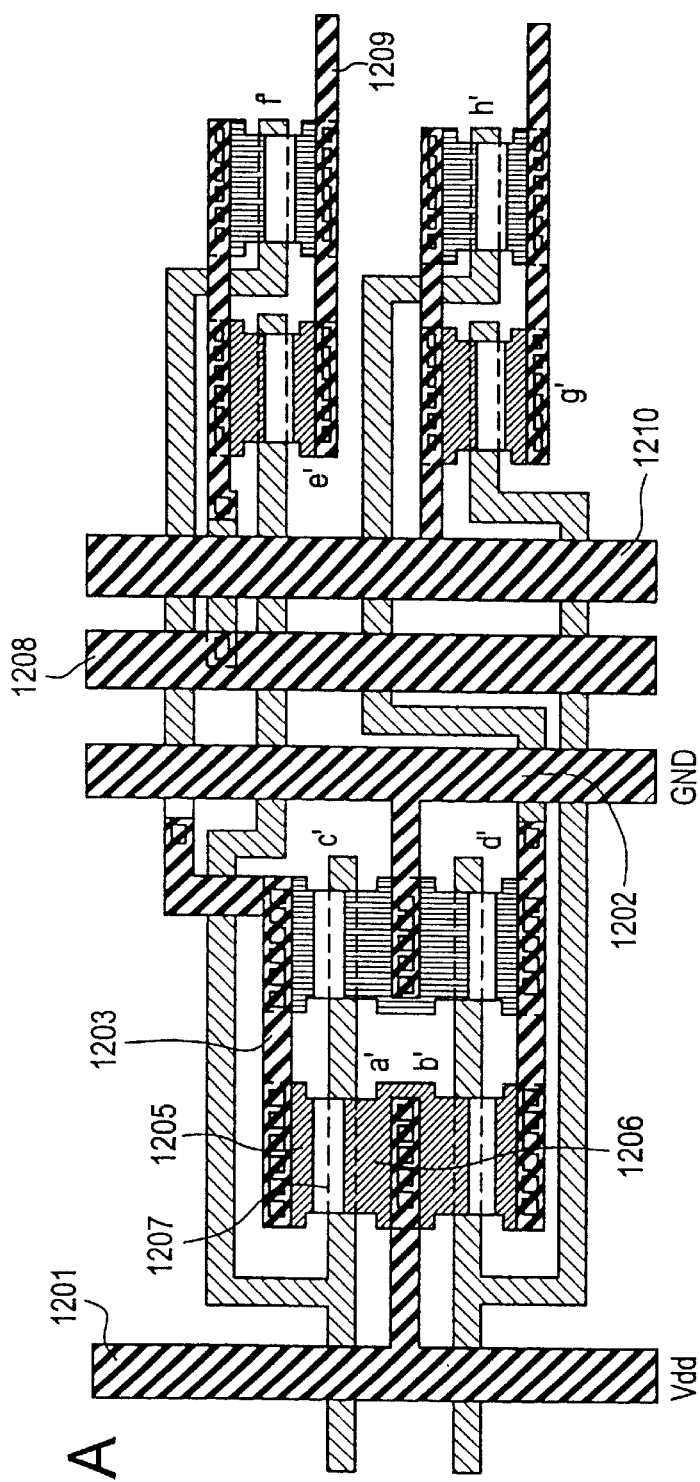
FIG. 28A and FIG. 28B show the pattern constitution of a semiconductor circuit in Embodiment 23.
Figure 28B:
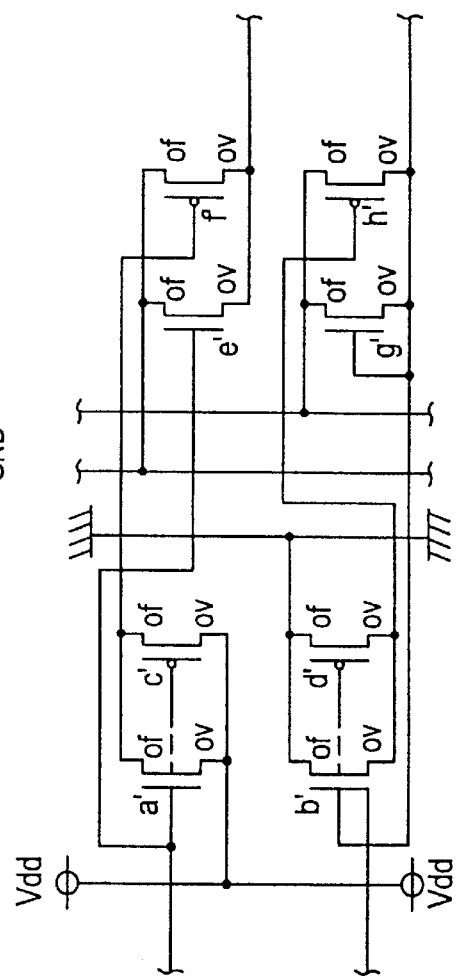

This is to demonstrate another embodiment of the constitution of a circuit comprising the inverse stagger-type TFT of the invention. Herein referred to are FIG. 28A and FIG. 28B that illustrate the constitution of a buffer circuit (the left side of the drawings) and an analog switch circuit (the right side of the drawings). In this Embodiment, employed is the layer structure of Embodiment 20. FIG. 28A shows a circuit pattern, and FIG. 28B shows the equivalent circuit pattern of FIG. 28A.

In FIG. 28(A), TFT (a') to TFT (h') are TFT of the invention. In this, TFT (a') and TFT (c'), and TFT (b') and TFT (d') form one buffer circuit each. Like the pixel matrix circuit, the buffer circuit is driven at a highest operating voltage in liquid crystal display devices, and is therefore required to have high voltage resistance.

TFT (e') and TFT (f'), and TFT (g') and TFT (h') (pairs for PTFT) form one analog switch circuit each. Also like the pixel matrix circuit, the analog switch circuit is driven at a highest operating voltage in liquid crystal display devices, and is therefore required to have high voltage resistance.

First referred to herein is the buffer circuit comprising TFT (a') and TFT (c'). 1201 is a source electrode (Vdd line) for TFT (a'); 1202 is a source electrode (GND line) for TFT (c'); 1203 is a common drain electrode (output signal line) for TFT (a') and TFT (c'); and 1204 is a common gate electrode (input signal line) for the two TFT.

1205 is a first conductive layer ($n^+$ layer) in the side of the drain region; 1206 is a first conductive layer ($n^+$ layer) in the side of the source region; and 1307 is a thin i-layer. TFT (c') has the same structure as above, except that a $p^{++}$ layer is substituted for the $n^+$ layer.

The buffer circuit has the structure of Embodiment 5 in order to have high voltage resistance. Specifically, in this circuit, an overlapping region (ov) is formed in the source side and a mask offset region (of) is in the drain side. In that condition, only the drain region is made to have high voltage resistance, while the resistance component in the source region is reduced.

The same structure can apply to the buffer circuit comprising TFT (b') and TFT (d').

Next referred to is the analog switch circuit comprising TFT (e') and TFT (f'). The gate electrode 1204 in the buffer circuit noted above is connected with the gate electrode for TFT (e'), while the common drain electrode for TFT (a') and TFT (c') is with the gate electrode for TFT (f').

1208 and 1210 are common source electrodes (input data signal lines) in the analog switch circuit; and 1209 is a common drain electrode (output data signal line). The electrode 1208 is for TFT (e') and TFT (f'); while the electrode 1210 is for TFT (g') and TFT (h'). These electrodes 1208 and 1210 transmit different image signals.

In this structure, when any one of TFT (e') or TFT (f') is "ON", the data signal (image signal) transferred from the input data signal line 1208 is transmitted to the pixel matrix circuit via the output data signal line 1209. Therefore, also in TFT (e') and TFT (f') constituting the analog switch circuit, a mask offset region is provided in the drain side and an overlapping region is in the source side.

The same structure can apply to the buffer circuit comprising TFT (g') and TFT (h').

Embodiment 24

This embodiment shows an example in which at the formation steps of the gate insulating film and the semiconductor film (amorphous silicon film) in the manufacturing steps of each Embodiment 1 to Embodiment 26, the respective films are continuously formed without being exposed to the atmosphere.

As a method of forming the gate insulating film and the semiconductor film, any method such as plasma CVD method and sputtering method can be employed. However, it is important to prevent contamination materials of the atmosphere (oxygen, boron, metal elements or the like) from attaching to the interface between the gate insulating film and the semiconductor film by avoiding exposure of the films to the atmosphere. In this embodiment, a multi-chamber (for instance, a device shown in FIG. 29) that is provided with an exclusive chamber for forming the gate insulating film and an exclusive chamber for forming starting semiconductor film, is used, and by moving each chamber, the gate insulating film and the semiconductor film are continuously formed so as to form a lamination without being exposed to the atmosphere. Incidentally, it is preferable to reduce the contamination material on the surface, where the semiconductor film is to be formed, by means of active hydrogen or hydrogen compounds before forming the semiconductor film.

Figure 29:
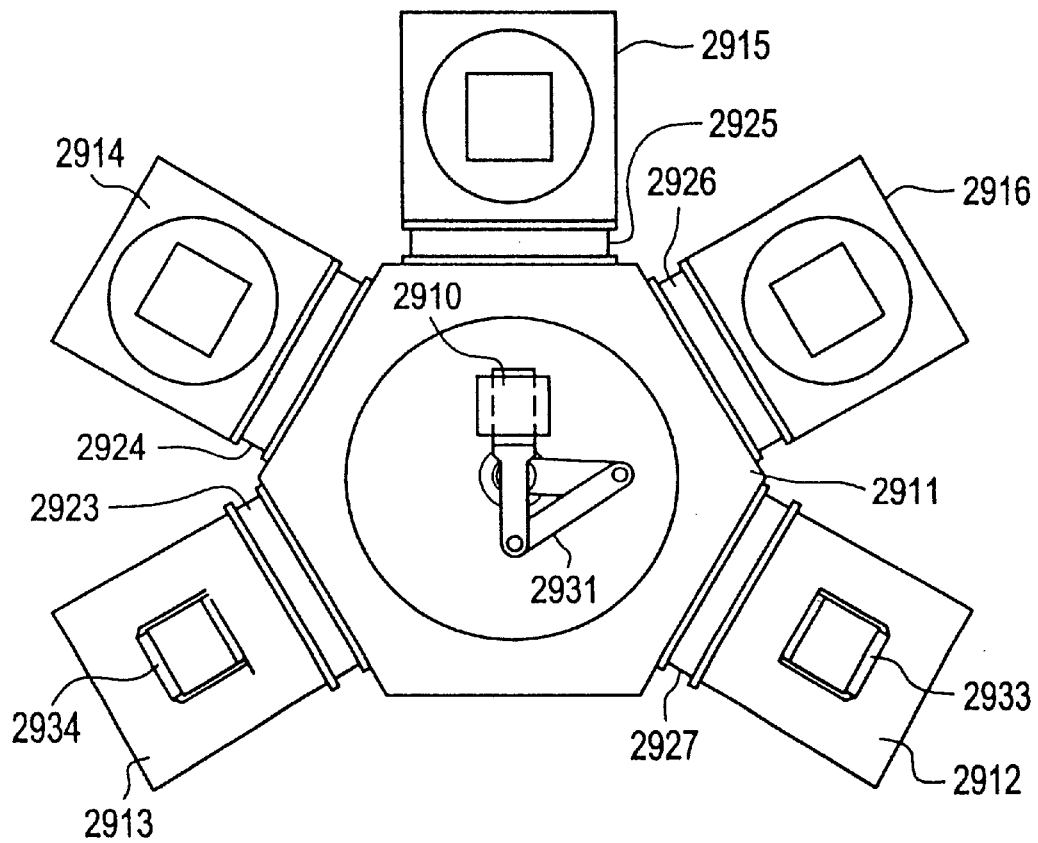
FIG. 29 shows the constitution of a multi chamber in Embodiment 24.

FIG. 29 schematically shows a device (a continuous film formation system) viewed from the top thereof, which will be described in this embodiment. In FIG. 29, reference numerals 2912–2916 denote chambers having air-tight property. A vacuum discharge pump and an inert gas introducing system are arranged in each chamber.

The present embodiment is applied to the cases in which the gate insulating film and the semiconductor film of Embodiment 1 are formed.

Chambers denoted by 2912 and 2913 serve as load-lock chambers for carrying a sample (substrate to be processed) 2910 into the system. Reference numeral 2914 denotes a first chamber for forming the gate insulating film (a first layer). Numeral 2915 denotes a second chamber for forming the gate insulating film (a second layer). Numeral 2916 denotes a third chamber for forming the semiconductor film (amorphous silicon film). Also, numeral 2911 denotes a common chamber of the sample, which is disposed commonly to each chamber. Reference numerals 2923–2927 denote gate valves of each chamber; 2931, a robot arm; 2933 and 2934, cassettes. In this embodiment, the case in which the gate insulating film has a double-layer structure is shown. It is needless to say, however, that the present embodiment is also applicable to a case in which the gate insulating film has a single-layer structure, and for example, to the case in which the gate insulating film is consisted from silicon oxide only.

In this embodiment, in order to prevent the contamination, the gate insulating film and the semiconductor film are formed so as to form a lamination by different chambers from each other utilizing the device shown in FIG. 29. It is a matter of course that the device shown in FIG. 29 is just an example.

Also, an arrangement is applicable in which a lamination is carried out by changing reaction gases within a single chamber. When serial film formation is conducted within the single chamber, it is preferable to reduce the contamination material, in particular, oxygen (because oxygen inhibits the crystallization) on the surface, where the semiconductor film is to be formed, by means of the active hydrogen or hydrogen compounds before forming the semiconductor film. In this case, degassing is carried out by changing oxygen attached to an inner wall of the chamber and electrodes into OH group by utilizing active hydrogen or hydrogen compounds which are generated from plasma process that uses a reaction gas such as hydrogen/$NH_3$, $H_2$, Ar and He. Accordingly, oxygen is prevented from mixing in upon the formation of the semiconductor film at the initial stage. Further, at the formation of each film, the same temperature(50_C) and the same pressure (20%) are preferably used.

With the above arrangement, contamination of the gate insulating film and the semiconductor film is prevented to thereby realize stable and good electrical characteristics.

As in the above, using the semiconductor device structure of the present invention in semiconductor circuits that are required to have high voltage resistance realizes the increase in the reliability of the semiconductor circuits. This is important for producing electro-optical devices of high reliability.

As has been described in detail hereinabove with reference to its embodiments, the present invention provides a technique of producing TFT on a mass-production scale in which is used an extremely small number of masks (typically, 4 masks).

According to the present invention, it is possible to form electric field buffer layers (LDD region, mask offset region, thickness offset region, etc.) for absorbing data fluctuations, between the channel-forming region and the source/drain electrodes in semiconductor devices. Providing the semiconductor devices of that type, therefore, the present invention realizes TFT of high reliability and high reproducibility.

In addition, the present invention is applicable to semiconductor devices of any and every type, including semiconductor circuits comprising TFT noted above, electro-optical devices comprising a combination of such semiconductor circuits and liquid crystal layers, etc., and even electronic instruments comprising displays of such electro-optical devices.

While the invention has been described in detail and with reference to specific embodiments thereof, it will be apparent to one skilled in the art that various changes and modifications can be made therein without departing from the spirit and scope thereof.

What is claimed is:

1. A method for producing a semiconductor device, comprising the steps:
    forming a gate electrode, a gate-insulating layer, and an amorphous semiconductor film on an insulating surface;
    exposing the amorphous semiconductor film to laser beams or to intense light equivalent to laser beams to thereby convert it into a semiconductor film having a crystalline structure;

adding an impurity selected from Group 15 only or from Group 13 and Group 15 to the semiconductor film having a crystalline structure to form conductive layers;

forming a source electrode and a drain electrode on the conductive layers, and etching the semiconductor film having a crystalline structure via the source electrode and the drain electrode both acting as masks for the film to thereby form a channel-forming region.

2. A method according to claim 1, further comprising at least once a laser annealing step of processing the semiconductor film having a crystalline structure.

3. A method according to claim 1, wherein the impurity selected from Group 15 is phosphorus, and that from Group 13 and Group 15 is boron and phosphorus.

4. A method according to claim 1, wherein the impurity addition is performed through ion implantation or ion doping.

5. A method according to claim 1, further comprising a step of performing heat treatment through lamp annealing.

6. A method according to claim 1, wherein at least said gate insulating film and said amorphous semiconductor film are formed continuously.

7. A method according to claim 6, wherein the continuous forming steps are performed in a multi-chamber.

8. A method according to claim 6, wherein thy continuous forming steps are performed in a single chamber.

9. A method according to claim 1, wherein the semiconductor device is a display device.

10. A method according to claim 1, wherein the semiconductor device is an electronic instrument selected from the group consisting of a video camera, a still camera, a projector, a projection TV, a head-mount display, a car navigation, a personal computer, a mobile computer, and a portable telephone.

11. A method for producing a semiconductor device, comprising the steps of:

forming a gate electrode, a gate-insulating layer, and an amorphous semiconductor film on an insulating surface;

exposing the amorphous semiconductor film to laser beams or to intense light equivalent to laser beams to thereby convert it into a semiconductor film having a crystalline structure;

adding an impurity selected from Group 15 only or from Group 13 and Group 15 to the semiconductor film having a crystalline structure to form conductive layers;

forming a source electrode and a drain electrode on the conductive layers;

etching the semiconductor film having a crystalline structure via the source electrode and the drain electrode both acting as masks for the film to thereby form a channel-forming region; and adding an impurity for threshold voltage control to the semiconductor film via the source electrode and the drain electrode both acting as masks for the film.

12. A method according to claim 11, further comprising at least once a laser annealing step of processing the semiconductor film having a crystalline structure.

13. A method according to claim 11, wherein the impurity selected from Group 15 is phosphorus, and that from Group 13 and Group 15 is boron and phosphorus.

14. A method according to claim 11, wherein the impurity addition is performed through ion implantation or ion doping.

15. A method according to claim 11, further comprising a step of performing heat treatment through lamp annealing.

16. A method according to claim 11, wherein at least said gate insulating film and said amorphous semiconductor film are formed continuously.

17. A method according to claim 16, wherein the continuous forming steps are performed in a multi-chamber.

18. A method according to claim 16, wherein the continuous forming steps are performed in a single chamber.

19. A method according to claim 11, wherein the semiconductor device is a display device.

20. A method according to claim 11, wherein the semiconductor device is an electronic instrument selected from the group consisting of a video camera, a still camera, a projector, a projection TV, a head-mount display, a car navigation, a personal computer, a mobile computer, and a portable telephone.

21. A method for producing a semiconductor device, comprising the steps of:

forming a gate electrode, a gate-insulating layer, and an amorphous semiconductor film on an insulating surface, exposing the amorphous semiconductor film to laser beams or to intense light of which the intensity is equivalent to that of laser beams, to thereby crystallize the film into a semiconductor film having a crystalline structure, adding an impurity selected from Group 13 and/or Group 15 to the semiconductor film having a crystalline structure through ion implantation or ion doping, to thereby form first and second conductive layers containing the impurity, exposing the conductive layers to laser beams or to intense light of which the intensity is equivalent to that of laser beams, to thereby activate the impurity, forming a source electrode and a drain electrode on the conductive layers, and etching the semiconductor film having a crystalline structure via the source electrode and the drain electrode both acting as masks for the film to thereby form a channel-forming region, wherein thicknesses of the first and second conductive layers are controlled by the concentration profile of the impurity.

22. A method according to claim 21, wherein the impurity selected from Group 13 is boron, indium or gallium, and that from Group 15 is phosphorus, arsenic or antimony.

23. A method according to claim 21, wherein at least said gate insulating film and said amorphous semiconductor film are formed continuously.

24. A method according to claim 23, wherein the continuous forming steps are performed in a multi-chamber.

25. A method according to claim 23, wherein the continuous forming steps are performed in a single chamber.

26. A method according to claim 21, wherein the semiconductor device is a display device.

27. A method according to claim 21, wherein the semiconductor device is an electronic instrument selected from the group consisting of a video camera, a still camera, a projector, a projection TV, a head-mount display, a car navigation, a personal computer, a mobile computer, and a portable telephone.

28. A method for producing a semiconductor device, comprising the steps of:

forming a gate electrode, a gate-insulating layer, and an amorphous semiconductor film on a substrate having an insulating surface, exposing the amorphous semiconductor film to laser beams or to intense light of which the intensity is equivalent to that of laser beams, to thereby crystallize the film into a semiconductor film having a crystalline structure, adding an impurity selected from Group 13 and/or Group 15 to the semiconductor film having a crystalline structure through ion implantation or ion doping, to thereby form first and second conductive layers containing the impurity, exposing the conductive layers to laser beams or to intense light of which the intensity is equivalent to that of laser beams, to thereby activate the impurity, forming a source electrode and a drain electrode on the conductive layers, etching the semiconductor film having a crystalline structure via the source electrode and the drain electrode both acting as masks for the film to thereby form a channel-forming region, and adding to the film an impurity for threshold voltage control, via the source electrode and the drain electrode both acting as masks for the film, wherein thicknesses of the first and second conductive layers are controlled by the concentration profile of the impurity.

29. A method according to claim 28, wherein the impurity selected from Group 13 is boron, indium or gallium, and that from Group 15 is phosphorus, arsenic or antimony.

30. A method according to claim 28, wherein at least said gate insulating film and said amorphous semiconductor film are formed continuously.

31. A method according to claim 30, wherein the continuous forming steps are performed in a multi-chamber.

32. A method according to claim 30, wherein the continuous forming steps are performed in a single chamber.

33. A method according to claim 28, wherein the semiconductor device is a display device.

34. A method according to claim 28, wherein the semiconductor device is an electronic instrument selected from the group consisting of a video camera, a still camera, a projector, a projection TV, a head-mount display, a car navigation, a personal computer, a mobile computer, and a portable telephone.

* * * * *